(12) United States Patent
Sugiura et al.

(10) Patent No.: US 7,897,487 B2
(45) Date of Patent: Mar. 1, 2011

(54) LASER PROCESSING METHOD AND CHIP

(75) Inventors: Ryuji Sugiura, Hamamatsu (JP); Takeshi Sakamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 622 days.

(21) Appl. No.: 11/822,151

(22) Filed: Jul. 2, 2007

(65) Prior Publication Data

US 2008/0000884 A1 Jan. 3, 2008

(30) Foreign Application Priority Data

Jul. 3, 2006 (JP) ................ P2006-183498
Aug. 14, 2006 (JP) ................ P2006-221161

(51) Int. Cl.
*H01L 21/00* (2006.01)

(52) U.S. Cl. ................ 438/463; 257/E21.237

(58) Field of Classification Search ................ 438/463, 438/460, 795, 796, 940; 219/121.6
See application file for complete search history.

(56) References Cited

U.S. PATENT DOCUMENTS

| 6,992,026 | B2 | 1/2006 | Fukuyo et al. | |
|---|---|---|---|---|
| 2004/0002199 | A1* | 1/2004 | Fukuyo et al. | 438/460 |
| 2005/0202596 | A1 | 9/2005 | Fukuyo et al. | |
| 2005/0272223 | A1 | 12/2005 | Fujii et al. | |
| 2006/0011593 | A1 | 1/2006 | Fukuyo et al. | |
| 2006/0144828 | A1 | 7/2006 | Fukumitsu et al. | |
| 2006/0148212 | A1 | 7/2006 | Fukuyo et al. | |
| 2006/0151443 | A1 | 7/2006 | Fukuyo et al. | |
| 2006/0255024 | A1 | 11/2006 | Fukuyo et al. | |
| 2007/0085099 | A1 | 4/2007 | Fukumitsu et al. | |
| 2007/0125757 | A1 | 6/2007 | Fukuyo et al. | |
| 2007/0158314 | A1 | 7/2007 | Fukumitsu et al. | |
| 2007/0170159 | A1 | 7/2007 | Fukumitsu | |

FOREIGN PATENT DOCUMENTS

| EP | 1 338 371 | 8/2003 |
|---|---|---|
| EP | 1 742 252 | 1/2007 |
| EP | 1 742 253 | 1/2007 |
| EP | 1 748 474 | 1/2007 |

(Continued)

OTHER PUBLICATIONS

K. Hayashi, "Inner Glass Marking by Harmonics of Solid-state Laser," Proceedings of $45^{th}$ Laser Materials Processing Conference, Dec. 1998, pp. 23-28, with English abstract.

(Continued)

*Primary Examiner* — Walter L Lindsay, Jr.
*Assistant Examiner* — Reema Patel
(74) *Attorney, Agent, or Firm* — Drinker Biddle & Reath LLP

(57) ABSTRACT

An object to be processed can be cut highly accurately along a line to cut.
An object to be processed 1 is irradiated with laser light while locating a converging point within a silicon wafer 11, and the converging point is relatively moved along a line to cut 5, so as to form modified regions M1, M2 positioned within the object 1 along the line to cut 5, and then a modified region M3 positioned between the modified regions M1, M2 within the object 1.

17 Claims, 26 Drawing Sheets

FOREIGN PATENT DOCUMENTS

| | | |
|---|---|---|
| EP | 1 775 059 | 4/2007 |
| EP | 1 777 031 | 4/2007 |
| EP | 1 804 280 | 7/2007 |
| EP | 1 811 550 | 7/2007 |
| EP | 1 811 551 | 7/2007 |
| JP | 2004-343008 | 12/2004 |
| JP | 2005-123329 | 5/2005 |
| JP | 2005-203541 | 7/2005 |
| JP | 2005-332841 | 12/2005 |

OTHER PUBLICATIONS

K. Miura et al., "Formation of Photo-induced Structures in Glasses with Femtosecond Laser," Proceedings of 42nd Laser Materials Processing Conference, Nov. 1997, pp. 105-111, with English abstract.

T. Sano et al., "Evaluation of Processing Characteristics of Silicon With Picosecond Pulse Laser," Preprints of the National Meeting of Japan Welding Society, No. 66, Apr. 2000, pp. 72-73, including English Language Translation.

\* cited by examiner

Fig.16
(a)
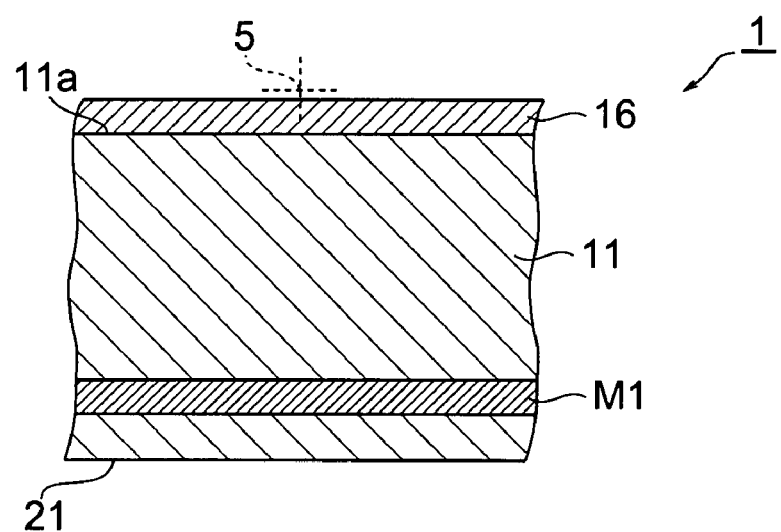
(b)
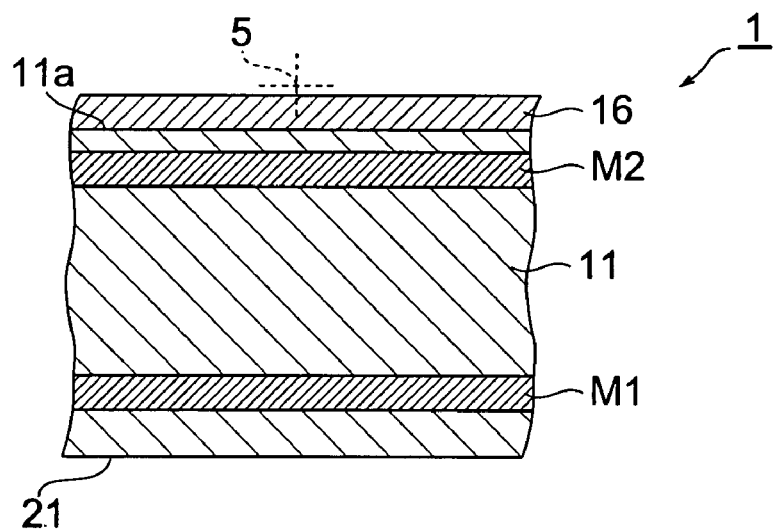

Fig.17
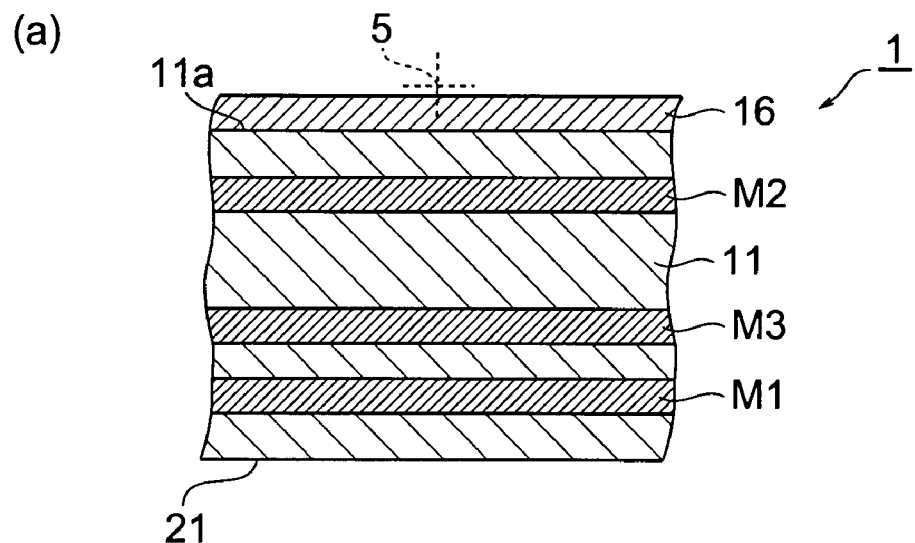
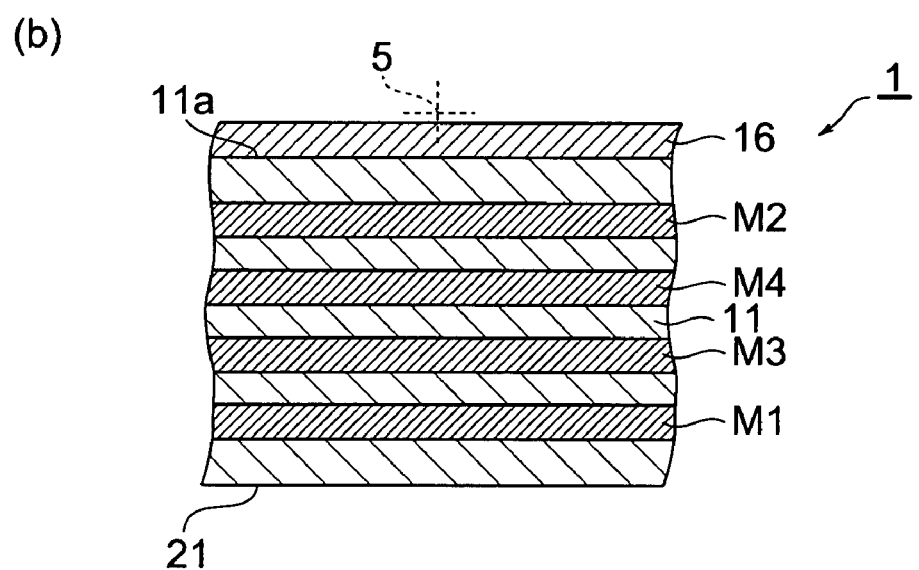

Fig.18
(a)
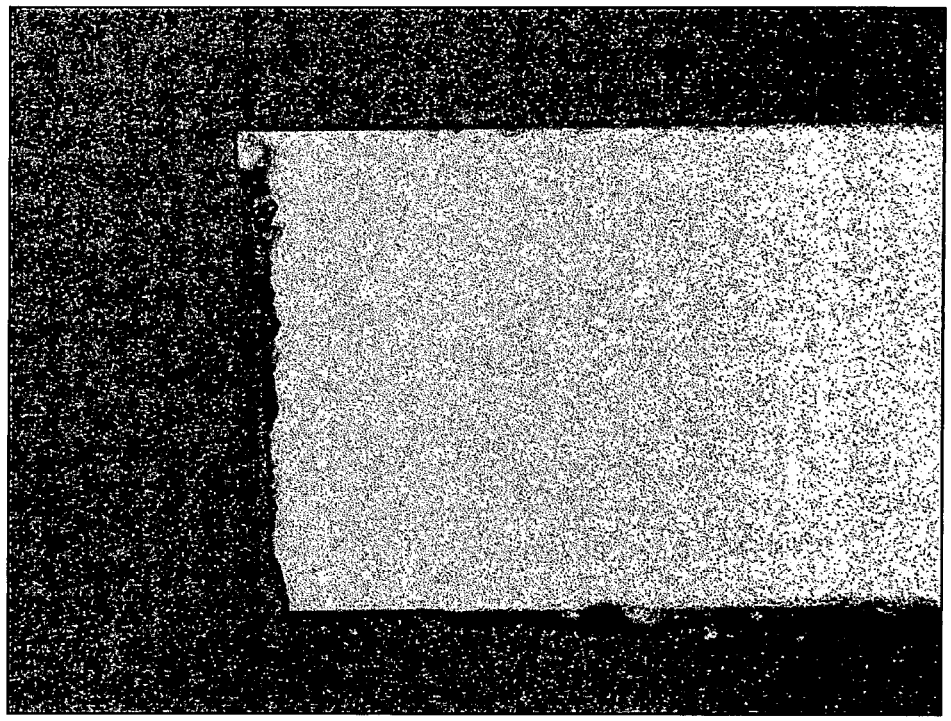
(b)
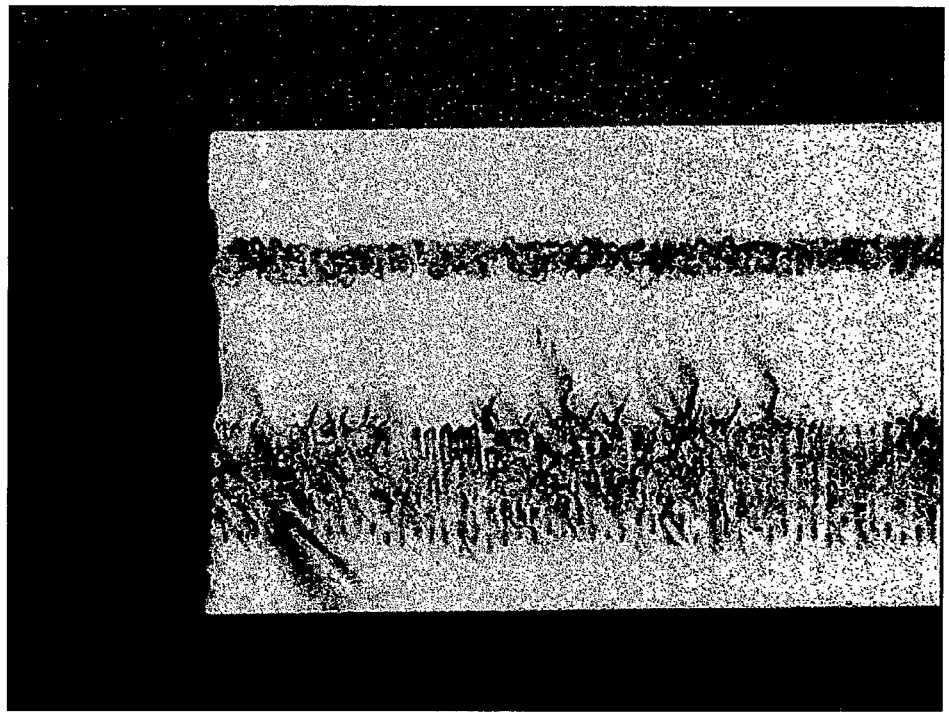

Fig.19
(a)
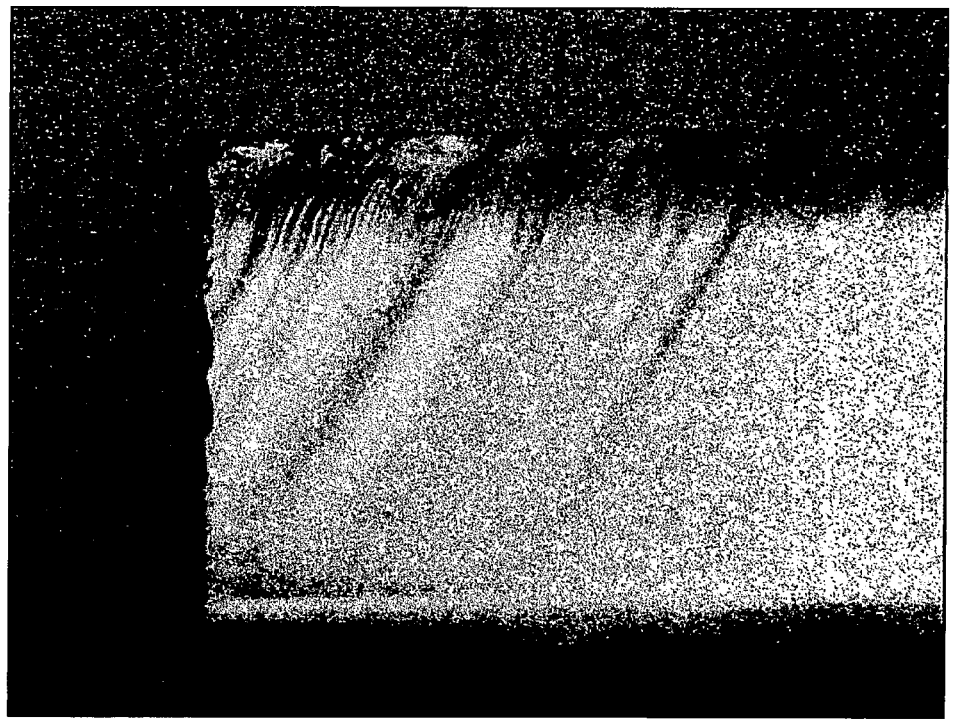
(b)
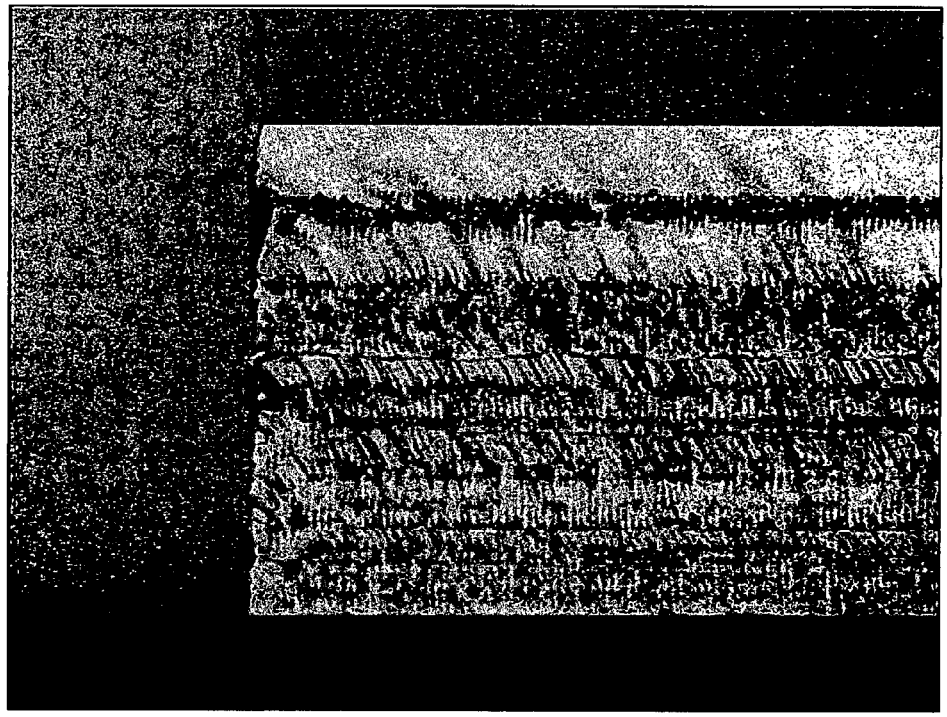

LASER PROCESSING METHOD AND CHIP

BACKGROUND OF THE INVENTION

1. Field of the Invention

The present invention relates to a laser processing method for cutting a planar object to be processed along a line to cut, and a chip.

2. Related Background Art

Known as a conventional laser processing method is one irradiating a planar object to be processed with laser light while locating a converging point within the object, thereby forming a plurality of rows of modified regions to become a cutting start point within the object along a line to cut in the object (see, for example, Japanese Patent Application Laid-Open No. 2004-343008).

SUMMARY OF THE INVENTION

However, laser processing methods such as one mentioned above may fail to accurately cut the object depending on the thickness, cleavage characteristic, and the like of the object, for example.

It is therefore an object of the present invention to provide a laser processing method which can highly accurately cut an object to be processed along a line to cut, and a chip obtained by using such a laser processing method.

For achieving the above-mentioned object, in one aspect, the present invention provides a laser processing method of irradiating a planar object to be processed with laser light while locating a converging point within the object, so as to form a modified region to become a cutting start point within the object along a line to cut in the object; the method comprising the steps of forming first and second modified regions, arranged in a row in a thickness direction of the object, along the line to cut; and forming a third modified region, positioned between the first and second modified regions, along the line to cut.

Here, it will be preferred in the step of forming the first and second modified regions if the first modified region is formed along the line to cut, and the second modified region positioned between the first modified region and a laser light entrance surface where the laser light is incident in the object is formed along the line to cut after forming the first modified region. Thus forming the first modified region within the object to be processed, the second modified region positioned between the first modified region and the laser light entrance surface, and the third modified region positioned between the first and second modified regions along the line to cut can prevent the end part of a cut section on the laser light entrance surface side from deviating greatly from the line to cut at the time of cutting the object, as compared with the case where the first, third, and second modified regions are formed in this order within the object (i.e., in the case where the modified regions are sequentially formed from the opposite side of the laser light entrance surface to the laser light entrance surface side). This is because that, when the first, third, and second modified regions are formed in this order within an object to be processed having a cleavage plane in a direction parallel to its thickness direction and tilted with respect to a plane including a line to cut, for example, a fracture may extend from the existing third modified region along the cleavage plane at the time of forming the second modified region, so as to deviate greatly from the line to cut, thereby reaching the laser light entrance surface.

Preferably, the method further comprises the step of forming a fourth modified region positioned between the second and third modified regions along the line to cut after forming the third modified region.

This can prevent the cut section from becoming uneven at the time of cutting the object, as compared with the case where the first, second, fourth, and third modified regions are formed in this order within the object. This is because that, when the first, second, fourth, and third modified regions are formed in this order within the object, the fourth modified region existing between the third modified region and the laser light entrance surface causes the scattering, absorption, and the like of the laser light at the time of forming the third modified region, so that the third modified region is not formed well, whereby fissures themselves may not be formed, a fracture extending from the third modified region and a fracture extending from a modified region adjacent to the third modified region may fail to connect with each other, and so forth.

There is a case where the object comprises a semiconductor substrate, while the modified region includes a molten processed region.

Preferably, the method further comprises the step of cutting the object along the line to cut from the modified region acting as a cutting start point. This can accurately cut the object along the line to cut.

Preferably, in the step of forming the third modified region, a fracture bridging at least the first and second modified regions is generated. In this case, forming the first and second modified regions arranged in a row in the thickness direction of the object generates a tensile stress toward both sides of the line to cut between the first and second modified regions in the object. Therefore, when the third modified region positioned between the first and second modified regions is formed, a fracture bridging at least the first and second modified regions can be generated from the third modified region acting as a trigger. Hence, if the modified region is formed near one surface of the object while the second modified region is formed near the other surface of the object, for example, fractures can be formed over substantially the whole part extending along the line to cut in the object without increasing the number of rows of modified regions to be formed per line to cut even when the object has a relatively large thickness. As in the foregoing, even when the planar object to be processed has a relatively large thickness, this laser processing method can shorten the time required for forming modified regions in the object, and enables highly accurate cutting of the object along the line to cut.

Each modified region is formed by generating multiphoton absorption or other kinds of absorption within the object upon irradiating the object with laser light while locating a converging point within the object.

In the laser processing method in accordance with the present invention, the third modified region may be formed along substantially the whole line to cut or one end part thereof. Since a tensile stress is generated toward both sides of the line to cut in the part between the first and second modified regions in the object as mentioned above, a fracture may advance over substantially the whole part between the first and second modified regions if only a small part of the third modified region positioned between the first and second modified regions is formed. Therefore, forming the third modified region along substantially the whole line to cut can prevent fractures from being stopped advancing by some causes and reliably form fractures over substantially the whole part between the first and second modified regions. Forming the third modified region along one end part of the line to cut, on the other hand, can form fractures over substantially the whole part between the first and second modified regions while further shortening the time required for forming the modified regions in the object.

Preferably, in the laser processing method in accordance with the present invention, the third modified region is formed such as to be biased toward one of the first and second modified regions closer to the laser entrance surface where the laser light is incident in the object. If the third modified region positioned between the first and second modified regions is formed, fractures initially advance from the third modified region to one of the first and second modified regions closer to the third modified region and then from the other modified region, which is farther from the laser light entrance surface, to the one modified region closer to the laser light entrance surface. (In the following, the distance required until a fracture advances from the other modified region to the one modified region along the line to cut will be referred to as "approach distance".) When the third modified region is formed such as to be biased toward one of the first and second modified regions closer to the laser light entrance surface, fractures can advance with a relatively short approach distance from the other modified region, which is farther from the laser light entrance surface, to the one modified region closer to the laser light entrance surface. Such a shorter approach distance enables a relatively small external force to cut the object along the line to cut.

In the laser processing method in accordance with the present invention, there is a case where the object comprises a semiconductor substrate, while the modified region includes a molten processed region.

In another aspect, the present invention provides a chip having a side face substantially parallel to a thickness direction; wherein the side face is formed with first and second modified regions arranged in a row in the thickness direction; a third modified region, positioned between the first and second modified regions, having a length in the thickness direction shorter than that of the first and second modified regions; and a Wallner line bridging at least the first and second modified regions and extending obliquely with respect to the thickness direction.

This chip is obtained by using the above-mentioned laser processing method in accordance with the present invention. Here, the reason why the length of the third modified region in the thickness direction becomes shorter than that of the first and second modified regions is that a fracture bridging the first and second modified regions occurs before forming the third modified region, whereby the degree of absorption of laser light at the converging point at the time of forming the third modified region decreases. The Wallner line extends obliquely with respect to the thickness direction because a fracture bridging the first and second modified regions advances obliquely with respect to the thickness direction.

When fractures advance, the Wallner line is formed so as to extend in a direction substantially perpendicular to the advancing direction.

Preferably, the chip further comprises a semiconductor substrate, and wherein the modified region includes a molten processed region.

BRIEF DESCRIPTION OF THE DRAWINGS

FIG. 16 is a partial sectional view, taken along the line XVI-XVI of FIG. 14, for explaining the laser processing method in accordance with the first embodiment;

FIG. 17 is a view for explaining a step of the laser processing method subsequent to that shown in FIG. 16;

FIG. 18(a) is a view showing a cut section of an object to be processed subjected to a conventional laser processing method, whereas FIG. 18(b) is a view showing a cut section of the object subjected to the laser processing method in accordance with the first embodiment;

FIG. 19(a) is a view showing a cut section of an object to be processed subjected to the laser processing method in accordance with a second embodiment of the present invention, whereas FIG. 19(b) is a cut section of the object subjected to the laser processing method in accordance with a third embodiment of the present invention;

DESCRIPTION OF THE PREFERRED EMBODIMENTS

In the following, preferred embodiments of the present invention will be explained in detail with reference to the drawings. In the laser processing methods in accordance with the embodiments, a phenomenon known as multiphoton absorption is used for forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is $hv > E_G$. However, even when optically transparent, the material generates absorption under a condition of $nhv > E_G$ (where $n=2, 3, 4, \ldots$) if the intensity of laser light becomes very high. This phenomenon is known as multiphoton absorption. In the case of pulsed waves, the intensity of laser light is determined by the peak power density ($W/cm^2$) of laser light at its converging point. The multiphoton absorption occurs under a condition where the peak power density is $1 \times 10^8$ ($W/cm^2$) or greater, for example. The peak power density is determined by (energy of laser light at the converging point per pulse)/(beam spot cross-sectional area of laser light×pulse width). In the case of continuous waves, the intensity of laser light is determined by the field intensity ($W/cm^2$) of laser light at the converging point.

Figure 1:
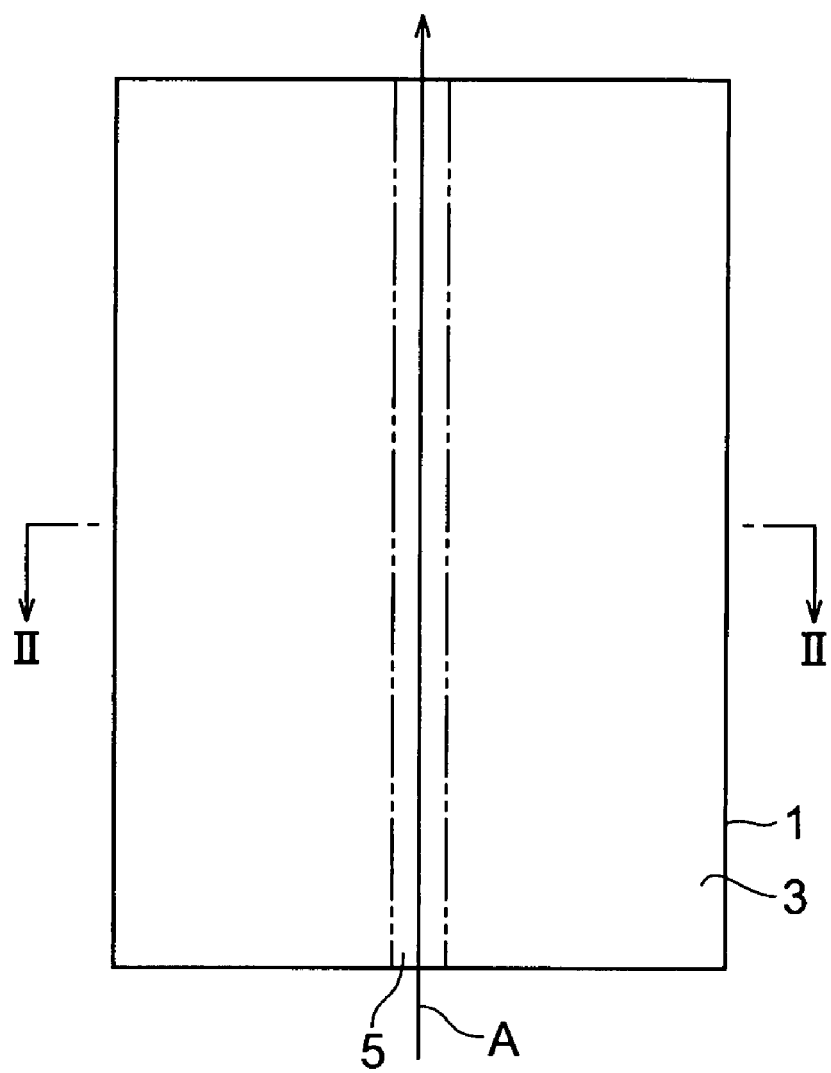
FIG. 1 is a plan view of an object to be processed during laser processing by the laser processing method in accordance with an embodiment.
Figure 2:
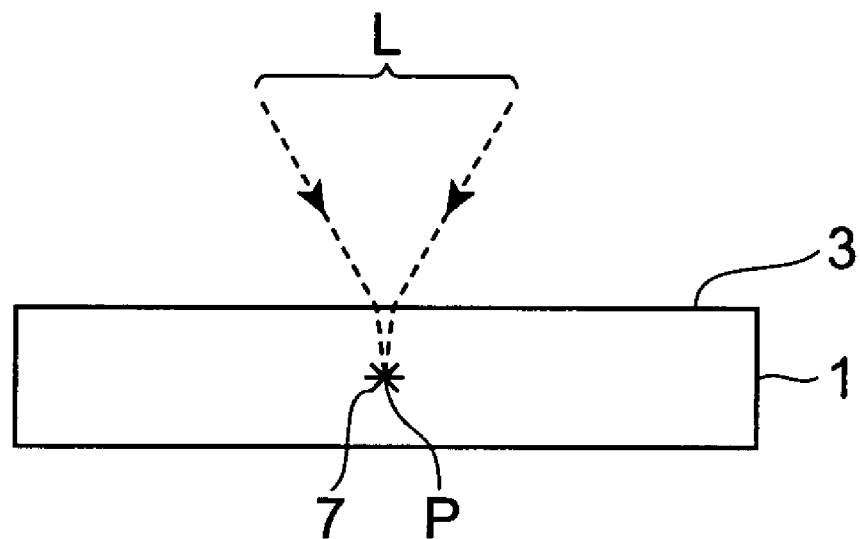
FIG. 2 is a sectional view of the object taken along the line II-II of FIG. 1.

The principle of the laser processing method in accordance with an embodiment using such multiphoton absorption will be explained with reference to FIGS. 1 to 6. As shown in FIG. 1, on a front face 3 of a wafer-like (planar) object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a converging point P therewithin under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 3:
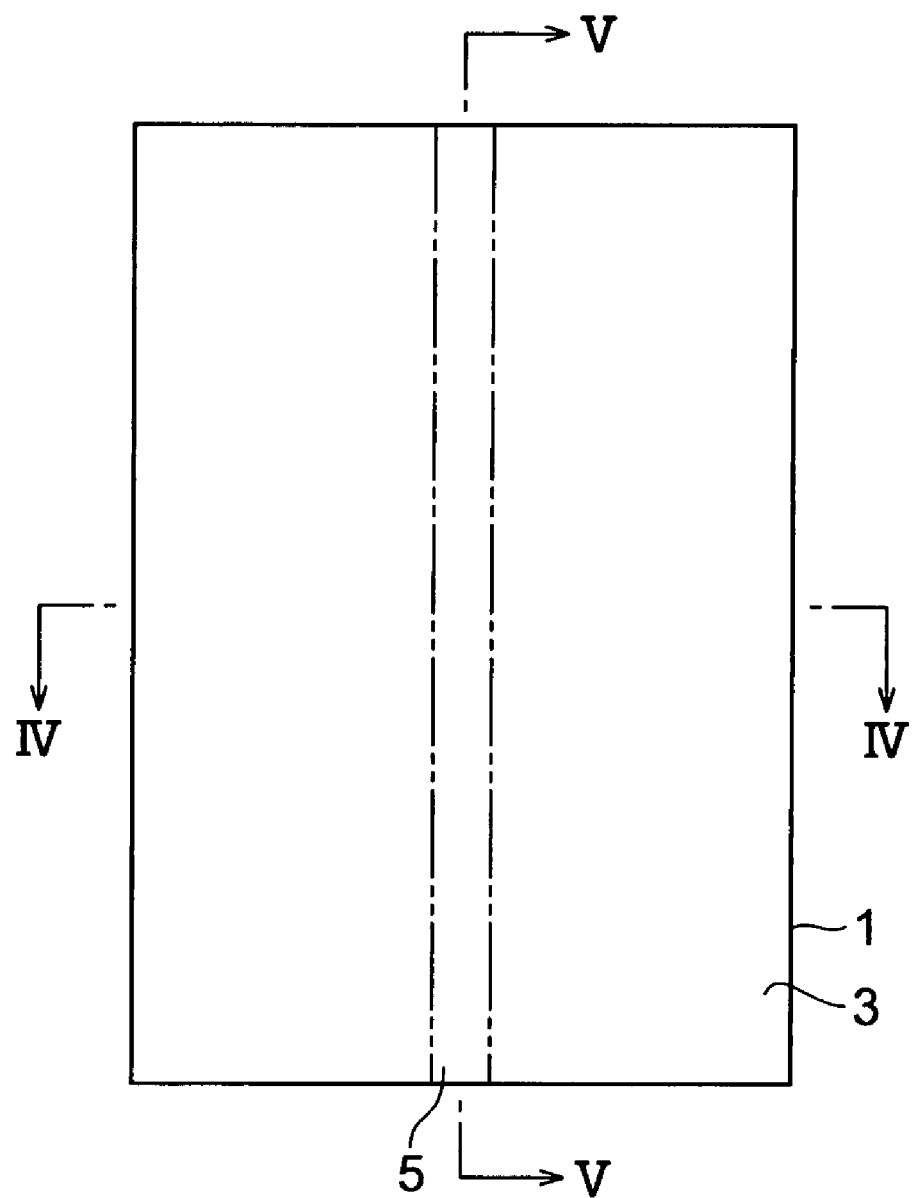
FIG. 3 is a plan view of the object after the laser processing by the laser processing method in accordance with the embodiment.
Figure 4:
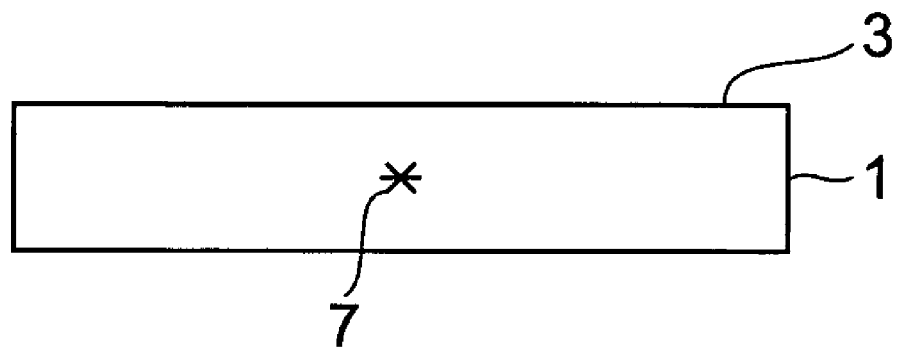
FIG. 4 is a sectional view of the object taken along the line IV-IV of FIG. 3.
Figure 5:
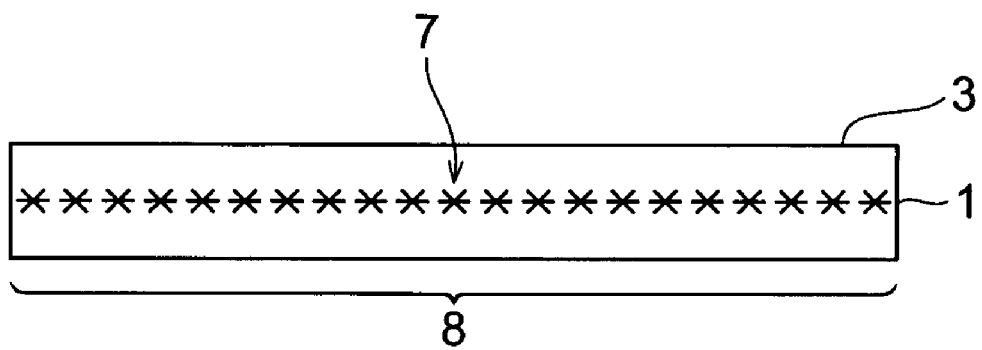
FIG. 5 is a sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as shown in FIGS. 3 to 5, the modified region 7 is formed along the line to cut 5 within the object 1, and becomes a starting point region for cutting 8. The starting point region for cutting 8 refers to a region which becomes a start point for cutting (fracturing) when the object 1 is cut. The starting point region for cutting 8 may be made by forming the modified region 7 either continuously or intermittently.

In the laser processing method in accordance with this embodiment, the front face 3 of the object 1 hardly absorbs the laser light L and thus does not melt.

Figure 6:
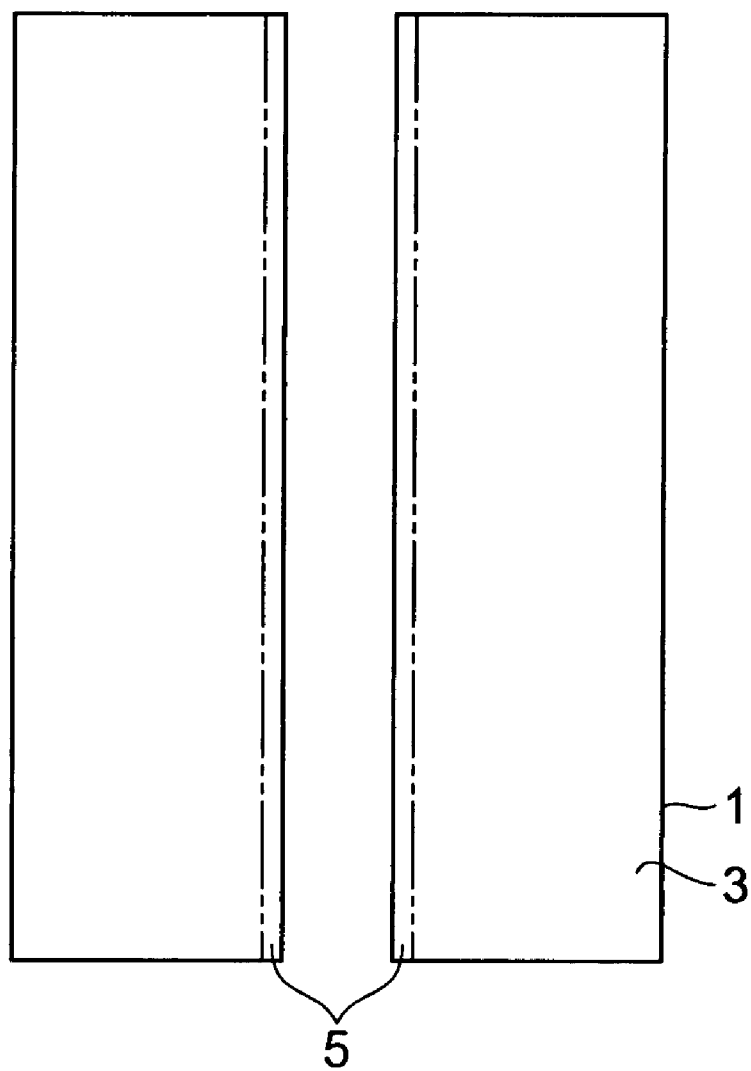
FIG. 6 is a plan view of the object cut by the laser processing method in accordance with the embodiment.

Forming the starting point region for cutting 8 within the object 1 makes it easier to generate fractures from the starting point region for cutting 8 acting as a start point, whereby the object 1 can be cut with a relatively small force as shown in FIG. 6. Therefore, the object 1 can be cut with a high precision without generating unnecessary fractures on the front face 3 of the object 1.

There seem to be the following two ways of cutting the object 1 from the starting point region for cutting 8 acting as a start point. One is where an artificial force is applied to the object 1 after the starting point region for cutting 8 is formed, so that the object 1 fractures from the starting point region for cutting 8 acting as a start point, whereby the object 1 is cut. This is the cutting in the case where the object 1 has a large thickness, for example. Applying an artificial force refers to exerting a bending stress or shear stress to the object 1 along the starting point region for cutting 8, or generating a thermal stress by applying a temperature difference to the object 1, for example. The other is where the forming of the starting point region for cutting 8 causes the object 1 to fracture naturally in its cross-sectional direction (thickness direction) from the starting point region for cutting 8 acting as a start point, thereby cutting the object 1. This becomes possible if the starting point region for cutting 8 is formed by one row of the modified region 7 when the object 1 has a small thickness, or if the starting point region for cutting 8 is formed by a plurality of rows of the modified region 7 in the thickness direction when the object 1 has a large thickness. Even in this naturally fracturing case, fractures do not extend onto the front face 3 at a portion corresponding to an area not formed with the starting point region for cutting 8 in the part to cut, so that only the portion corresponding to the area formed with the starting point region for cutting 8 can be cleaved, whereby cleavage can be controlled well. Such a cleaving method with a favorable controllability is very effective, since the object 1 to be processed such as silicon wafer has recently been apt to decrease its thickness.

The modified region formed by multiphoton absorption in the laser processing method in accordance with this embodiment encompasses the following cases (1) to (3):

(1) Case where the modified region is a crack region including one crack or a plurality of cracks An object to be processed (e.g., glass or a piezoelectric material made of $LiTaO_3$) is irradiated with laser light while locating a converging point therewithin under a condition with a field intensity of at least $1 \times 10^8$ ($W/cm^2$) at the converging point and a pulse width of 1 µs or less. This magnitude of pulse width is a condition under which a crack region can be formed only within the object while generating multiphoton absorption without causing unnecessary damages on the front face of the object. This generates a phenomenon of optical damage by multiphoton absorption within the object. This optical damage induces a thermal distortion within the object, thereby forming a crack region therewithin. The upper limit of field intensity is $1 \times 10^{12}$ ($W/cm^2$), for example. The pulse width is preferably 1 ns to 200 ns, for example. The forming of a crack region by multiphoton absorption is disclosed, for example, in "Internal Marking of Glass Substrate with Solid-state Laser", Proceedings of the 45th Laser Materials Processing Conference (December, 1998), pp. 23-28.

The inventors determined the relationship between field intensity and crack size by an experiment. The following are conditions of the experiment.

(A) Object to be processed: Pyrex® glass (with a thickness of 700 µm)

(B) Laser light source: semiconductor laser pumping Nd:YAG laser wavelength: 1064 nm laser light spot cross-sectional area: $3.14 \times 10^{-8}$ $cm^2$ oscillation mode: Q-switched pulse repetition frequency: 100 kHz pulse width: 30 ns
output: output <1 mJ/pulse
laser light quality: TEM$_{00}$
polarizing property: linear polarization
(C) Condenser lens
transmittance at a laser light wavelength: 60%
(D) Moving rate of the mount table mounting the object: 100 mm/sec The laser light quality of TEM$_{00}$ means that the converging characteristic is so high that convergence to about the wavelength of laser light is possible.

Figure 7:
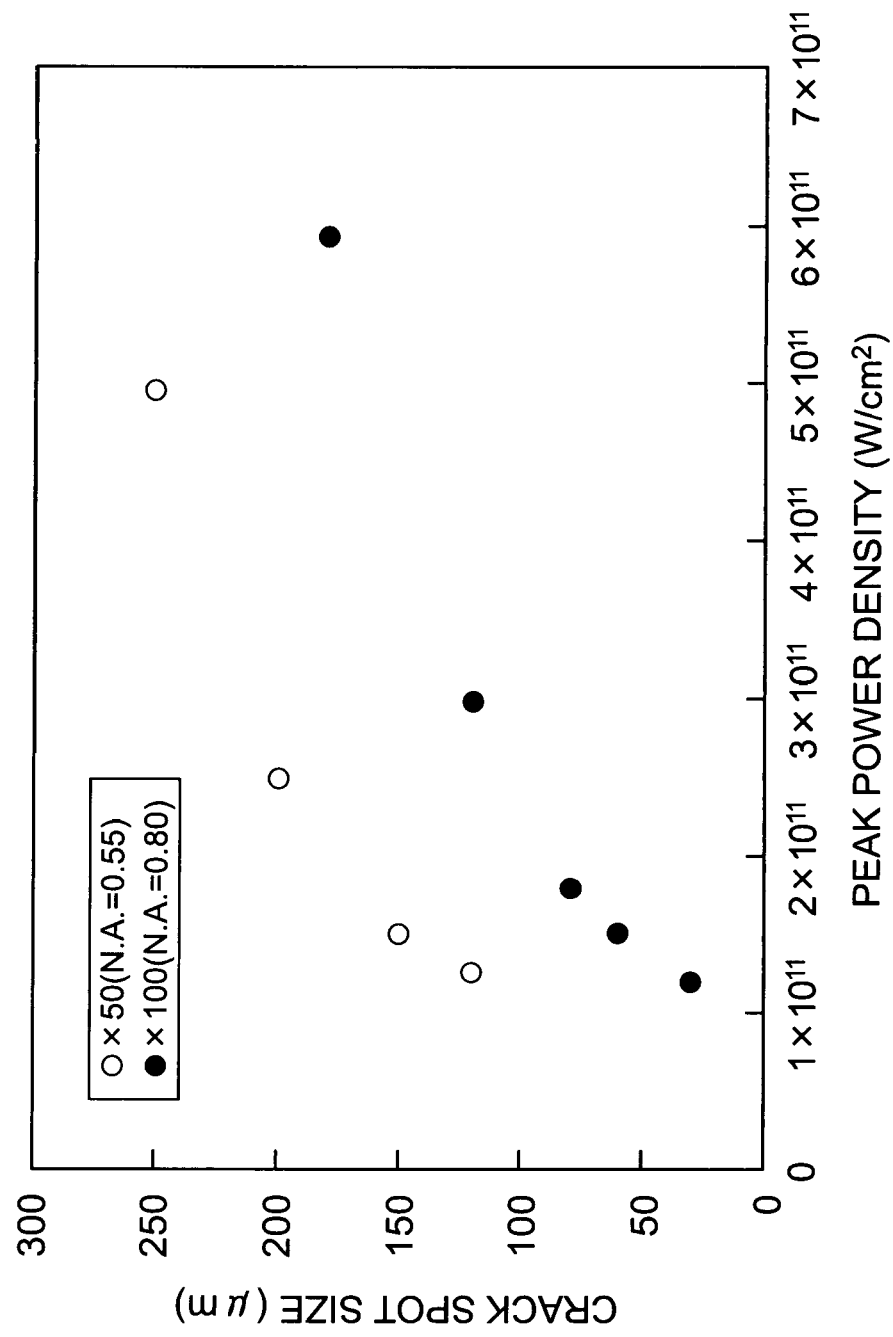
FIG. 7 is a graph showing relationships between the field intensity and crack spot size in the laser processing method in accordance with the embodiment.

FIG. 7 is a graph showing the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
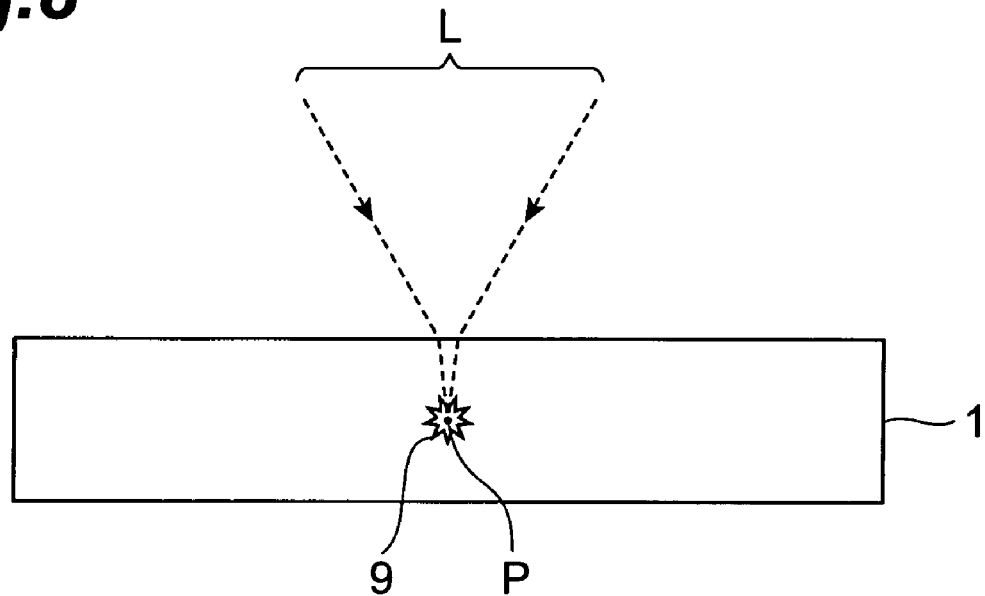
FIG. 8 is a sectional view of the object in a first step of the laser processing method in accordance with the embodiment.
Figure 9:
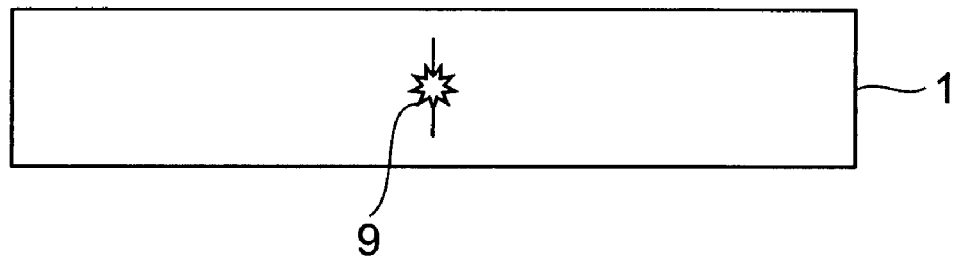
FIG. 9 is a sectional view of the object in a second step of the laser processing method in accordance with the embodiment.
Figure 10:
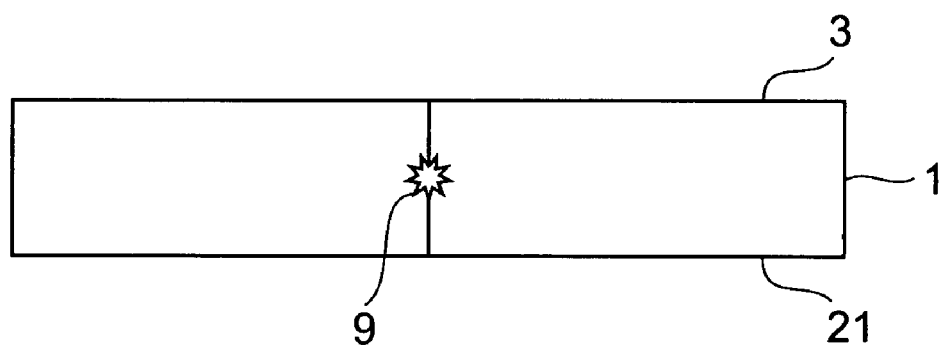
FIG. 10 is a sectional view of the object in a third step of the laser processing method in accordance with the embodiment.
Figure 11:
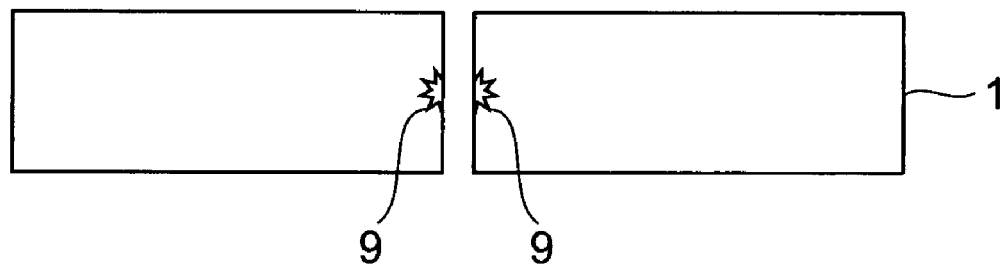
FIG. 11 is a sectional view of the object in a fourth step of the laser processing method in accordance with the embodiment.

A mechanism by which the object to be processed is cut by forming a crack region will now be explained with reference to FIGS. 8 to 11. As shown in FIG. 8, the object 1 is irradiated with laser light L while the converging point P is located within the object 1 under a condition where multiphoton absorption occurs, so as to form a crack region 9 therewithin along a line to cut. The crack region 9 is a region containing one crack or a plurality of cracks. Thus formed crack region 9 becomes a starting point region for cutting. A crack further grows from the crack region 9 acting as a start point (i.e., from the starting point region for cutting acting as a start point) as shown in FIG. 9, and reaches the front face 3 and rear face 21 of the object 1 as shown in FIG. 10, whereby the object 1 fractures and is consequently cut as shown in FIG. 11. The crack reaching the front face 3 and rear face 21 of the object 1 may grow naturally or as a force is applied to the object 1.

(2) Case where the modified region is a molten processed region

An object to be processed (e.g., semiconductor material such as silicon) is irradiated with laser light while locating a converging point within the object under a condition with a field intensity of at least $1\times10^8$ (W/cm$^2$) at the converging point and a pulse width of 1 μs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1\times10^{12}$ (W/cm$^2$), for example. The pulse width is preferably 1 ns to 200 ns, for example.

By an experiment, the inventors verified that a molten processed region was formed within a silicon wafer (semiconductor substrate). The following are conditions of the experiment.

Figure 12:
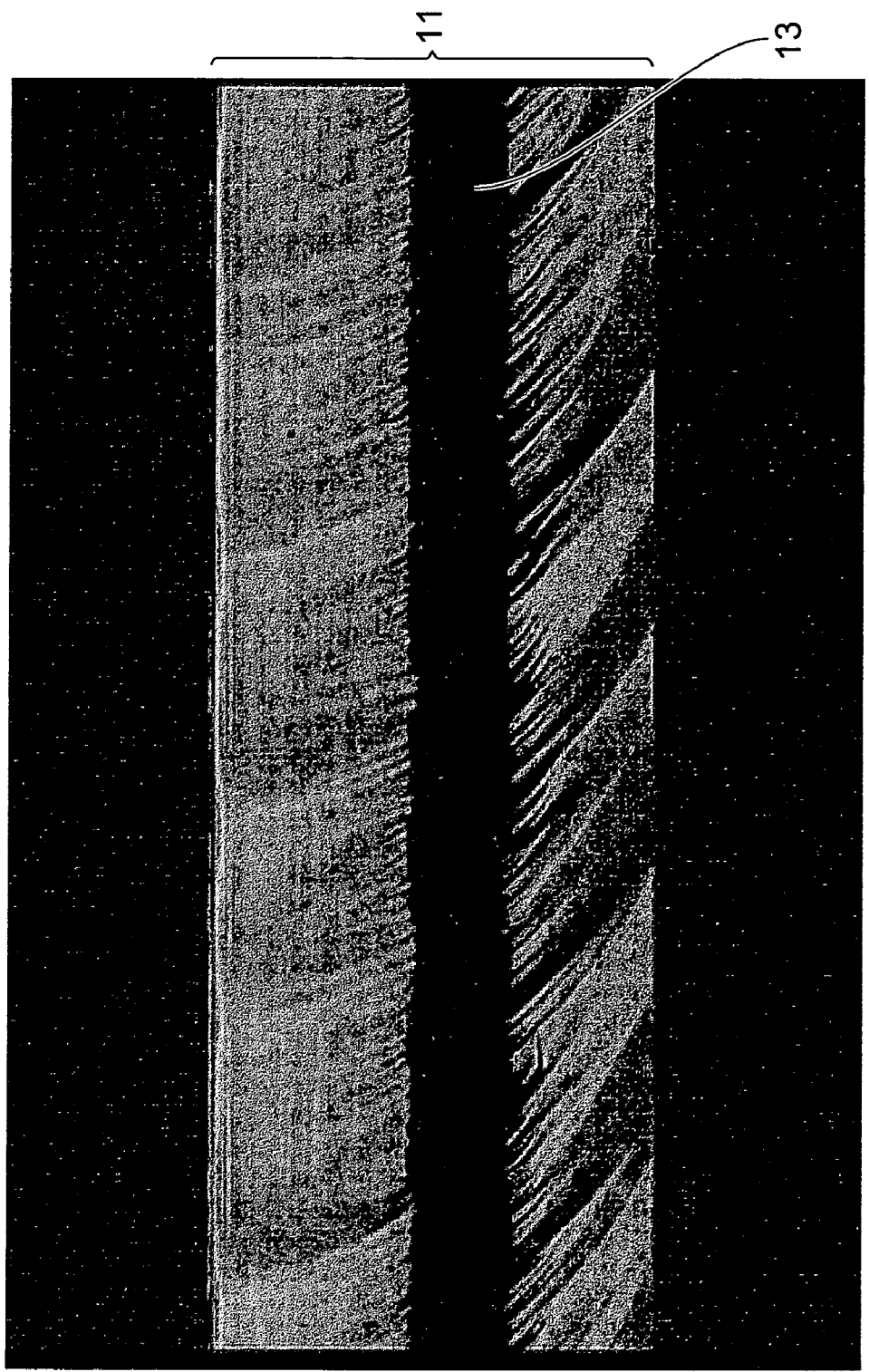
FIG. 12 is a view showing a photograph of a cut section in a part of a silicon wafer cut by the laser processing method in accordance with the embodiment.

(A) Object to be processed: silicon wafer (with a thickness of 350 μm and an outer diameter of 4 inches)
(B) Laser
light source: semiconductor laser pumping Nd:YAG laser
wavelength: 1064 nm
laser light spot cross-sectional area: $3.14\times10^{-8}$ cm$^2$
oscillation mode: Q-switched pulse
repetition frequency: 100 kHz
pulse width: 30 ns
output: 20 μJ/pulse
laser light quality: TEM$_{00}$
polarizing property: linear polarization
(C) Condenser lens
magnification: ×50
N.A.: 0.55
transmittance at a laser light wavelength: 60%
(D) Moving rate of the mount table mounting the object: 100 mm/sec FIG. 12 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 μm in the thickness direction.

Figure 13:
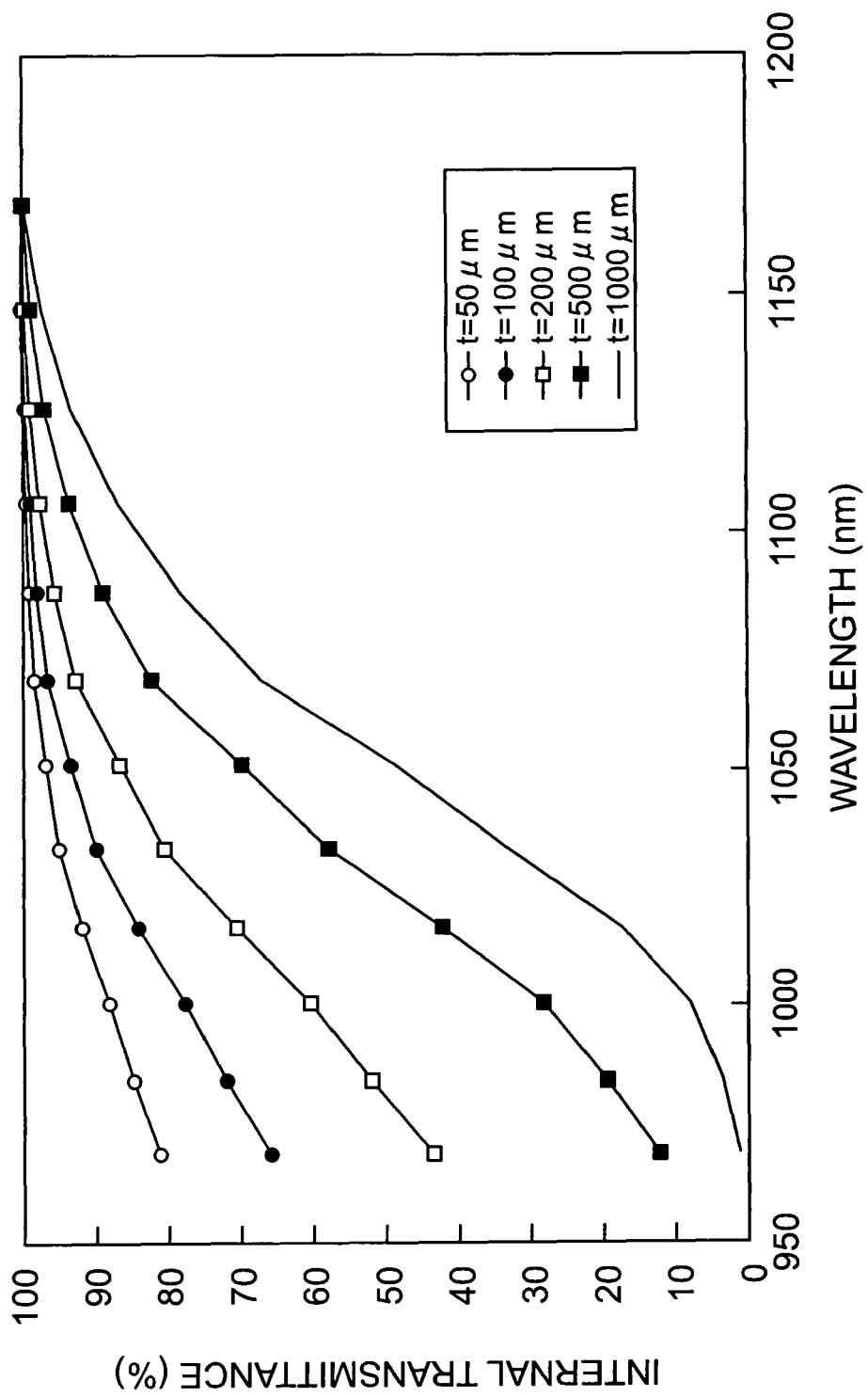
FIG. 13 is a graph showing relationships between the laser light wavelength and the transmittance within a silicon substrate in the laser processing method in accordance with the embodiment.

The fact that the molten processed region 13 is formed by multiphoton absorption will now be explained. FIG. 13 is a graph showing relationships between the laser light wavelength and the transmittance within the silicon substrate. Here, the respective reflected components on the front and rear sides of the silicon substrate are eliminated, so as to show the internal transmittance alone. The respective relationships are shown in the cases where the thickness t of the silicon substrate is 50 μm, 100 μm, 200 μm, 500 μm, and 1000 μm.

For example, at the Nd:YAG laser wavelength of 1064 nm, the laser light appears to be transmitted through the silicon substrate by at least 80% when the silicon substrate has a thickness of 500 μm or less. Since the silicon wafer 11 shown in FIG. 12 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

A fracture is generated in a silicon wafer from a starting oint region for cutting formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state where the molten processed region forming the starting point region for cutting is molten and a case where the fracture grows when the molten processed region forming the starting point region for cutting is re-solidified from the molten state. In either case, the molten processed region is formed only within the silicon wafer, and thus is present only within the cut section after cutting as shown in FIG. 12. When a starting point region for cutting is thus formed within the object by a molten processed region, unnecessary fractures deviating from a starting point region for cutting line are harder to occur at the time of cleaving, whereby cleavage control becomes easier. Here, the molten processed region may be formed not only by multiphoton absorption but also by other absorption actions.

(3) Case where the modified region is a refractive index changed region

An object to be processed (e.g., glass) is irradiated with laser light while locating a converging point within the object under a condition with a field intensity of at least $1 \times 10^8$ (W/cm$^2$) at the converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is $1 \times 10^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

The cases (1) to (3) are explained in the foregoing as a modified region formed by multiphoton absorption. A starting point region for cutting may be formed as follows while taking account of the crystal structure of a wafer-like object to be processed, its cleavage characteristic, and the like, whereby the object can be cut with a favorable precision by a smaller force from the starting point region for cutting acting as a start point.

Namely, in the case of a substrate made of a monocrystal semiconductor having a diamond structure such as silicon, it will be preferred if a starting point region for cutting is formed in a direction extending along a (111) plane (first cleavage plane) or a (110) plane (second cleavage plane). In the case of a substrate made of a group III-V compound semiconductor of sphalerite structure such as GaAs, it will be preferred if a starting point region for cutting is formed in a direction extending along a (110) plane. In the case of a substrate having a crystal structure of hexagonal system such as sapphire (Al$_2$O$_3$), it will be preferred if a starting point region for cutting is formed in a direction extending along a (1120) plane (A plane) or a (1100) plane (M plane) while using a (0001) plane (C plane) as a principal plane.

When the substrate is formed with an orientation flat in a direction to be formed with the above-mentioned starting point region for cutting (e.g., a direction extending along a (111) plane in a monocrystal silicon substrate) or a direction orthogonal to the former direction, the starting point region for cutting extending in the direction to be formed with the starting point region for cutting can be formed easily and accurately with reference to the orientation flat.

Preferred embodiments of the present invention will now be explained.

First Embodiment

Figure 14:
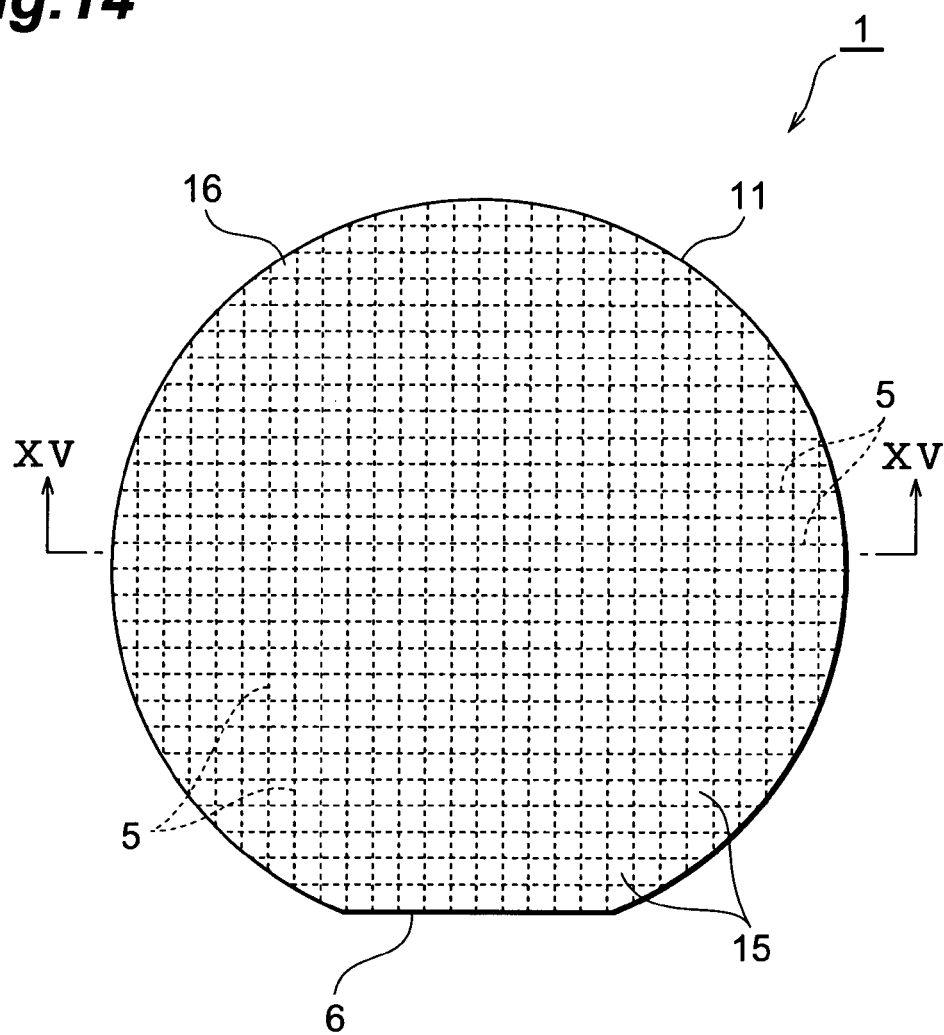
FIG. 14 is a front view showing an object to be processed which is subjected to the laser processing method in accordance with a first embodiment.
Figure 15:
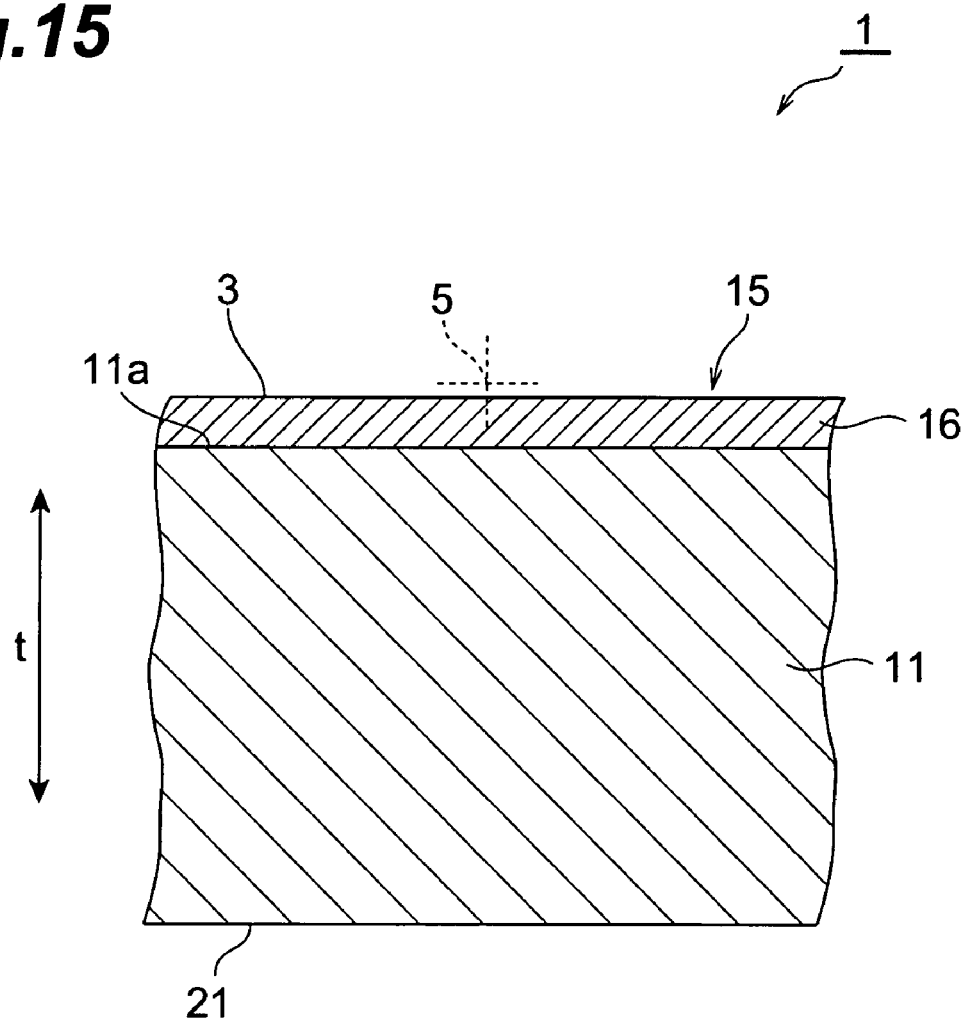
FIG. 15 is a partial sectional view taken along the line XV-XV of FIG. 14.

As shown in FIGS. 14 and 15, an object to be processed 1 comprises a silicon wafer 1, and a functional device layer 16 which is formed on the front face 11a of the silicon wafer 11a while including a plurality of functional devices 15. The silicon wafer 11 has such a crystal orientation that fractures are easy to extend in a direction different from its thickness direction t. Specifically, the silicon wafer 11 is a crystal structure having a cleavage plane in a direction parallel to its thickness direction and tilted with respect to a plane including a line to cut 5 which will be explained later, while fractures are likely to extend in a direction along the cleavage plane. Here, the front face 11a of the silicon wafer 11 is a (111) surface.

A number of functional devices 15, examples of which include semiconductor operating layers formed by crystal growth, light-receiving devices such as photodiodes, light-emitting devices such as laser diodes, and circuit devices formed as circuits, are formed like a matrix in directions parallel and perpendicular to an orientation flat 6 of the silicon wafer 11. Such an object to be processed 1 is cut by laser processing along lines to cut (see broken lines in FIG. 14) which are set like grids such as to pass between adjacent functional devices, so as to yield discrete devices and the like which are microchips.

When cutting this object to be processed 1, an expandable tape, for example, is initially attached to the rear face 21 of the object 1. Subsequently, using the front face 3 of the object 1 as a laser light entrance surface, the silicon wafer 11 is irradiated with laser light from this laser light entrance surface 11a while locating a converging point within the silicon wafer 11, so as to form a modified region to become a cutting start point along each line to cut 5. Then, the expandable tape is expanded. Consequently, the object 1 is accurately cut into the individual functional devices 15 along the lines to cut 5 while using the modified regions as cutting start points, whereby a plurality of semiconductor chips are separated from each other. The modified regions may include not only molten processed regions but also crack regions and the like.

The forming of modified regions mentioned above will now be explained in more detail.

First, as shown in FIG. 16(a), the object 1 is irradiated with laser light while locating a converging point within the silicon wafer 11, and the converging point is relatively moved along the lines to cut 5, so as to form one row of modified region M1 within the object 1 along the lines to cut 5. Here, the modified region M1 is positioned near the rear face 21 within the silicon wafer 11.

Subsequently, as shown in FIG. 16(b), the object 1 is irradiated with laser light while locating a converging point within the silicon wafer 11, and the converging point is relatively moved along the lines to cut 5, so as to form one row of modified region M2 positioned between the modified region M1 and the laser light entrance surface 3 within the object 1 along the lines to cut 5. Here, the modified region M2 is positioned near the front face 3 within the silicon wafer 11.

Next, as shown in FIG. 17(a), the object 1 is irradiated with laser light while locating a converging point within the silicon wafer 11, and the converging point is relatively moved along the lines to cut 5, so as to form one row of modified region M3 positioned between the modified regions M1 and M2 within the object 1 along the lines to cut 5. Here, the modified region M3 is positioned on the rear face 21 side between the modified regions M1 and M2 within the silicon wafer 11.

Subsequently, as shown in FIG. 17(b), the object 1 is irradiated with laser light while locating a converging point within the silicon wafer 11, and the converging point is relatively moved along the lines to cut 5, so as to form one row of modified region M4 positioned between the modified regions M2 and M3 within the object 1 along the lines to cut 5. Here, the modified region M4 is positioned between the modified regions M2 and M3 within the silicon wafer 11.

In general, in order to prevent laser light from being scattered, absorbed, and so forth by modified regions positioned between the front face 3 where the laser light is incident and the converging point of the laser light in the object 1, the conventional laser processing methods sequentially form a plurality of rows of modified regions from the rear face 21 side to the front face 3 side, i.e., the modified regions M1, M3, M4, and M2 in this order, within the object 1. When cutting the object 1 in this case, however, the end part of the cut section on the front face 3 side may deviate greatly from the line to cut 5, thereby retracting or projecting like a skirt (see FIG. 18(a)).

The inventors therefore conducted diligent studies and, as a result, have found that the following phenomenon causes the end part of the cut section on the front face 3 side to deviate greatly from the line to cut 5 when cutting the object 1. Namely, when forming the second modified region M2 in the case where a plurality of rows of modified regions M1, M3, M4, and M2 are formed in this order within the object 1, a fracture may occur in a direction along the cleavage plane of the silicon wafer 11 from the existing modified region M4 adjacent to the modified region M2, or a fracture extending from the modified region M4 may grow largely in a direction along the cleavage plane, thereby greatly deviating from the line to cut 5 and reaching the front face 3. Further, when forming the second modified region M2 in the case where a plurality of rows of modified regions are thus sequentially formed from the rear face 21 side to the front face 3 side, a fracture may occur in a direction along the cleavage plane of the silicon wafer 11 from the existing modified region M3, or a fracture extending from the modified region M3 may grow largely in a direction along the cleavage plane, thereby greatly deviating from the line to cut 5 and reaching the front face 3. Therefore, the end part of the cut section on the front face 3 side may deviate greatly from the line to cut 5 when cutting the object 1.

The inventors further conducted studies according to the findings mentioned above, and have formed the modified region M1 within the object 1, the modified region M2 positioned between the modified region M1 and the front face 3 of the object 1, and the modified region M3 positioned between the modified regions M1 and M2 along the lines to cut 5. In other words, within the object 1, modified regions are successively formed at positions deeper and shallower from the front face 3, respectively, and then a modified region is formed at an intermediate position between these modified regions.

This can suppress the above-mentioned phenomenon, i.e., the phenomenon that the fracture deviates greatly from the line to cut 5 and reaches the front face 3 of the object 1, and thus can prevent the end part of the cut section on the front face 3 side from deviating greatly from the line to cut 5 when cutting the object 1, as compared with the case where a plurality of modified regions M1, M3, M4, and M2 are formed in this order within the object 1. Resultantly, as shown in FIG. 18(b), the front face side of the cut section can be kept from projecting like a skirt even when the object is a crystal structure having a cleavage plane parallel to its thickness direction and tilted with respect to a plane including the line to cut, whereby the end face quality of the cut section can be improved.

On the other hand, the cut section may become uneven when cutting the object 1 in the case where the modified regions M1, M2, M4, and M3 are formed in this order within the object 1. This is because the laser light is scattered, absorbed, and so forth by the modified region M4 existing between the modified region M3 to be formed and the front face 3 when forming the modified region M3 in this case, whereby fissures themselves may not be formed, fractures extending from the third modified region M3 and fractures extending from modified regions M1, M4 adjacent to the third modified region M3 may fail to connect with each other, and so forth.

However, as mentioned above, the laser processing method in accordance with this embodiment forms the modified region M4 positioned between the modified regions M2 and M3 within the object 1 along the lines to cut 5 after forming the modified region M3, and thus can connect the fractures extending from the modified region M3 to the fractures extending from the modified regions M1, M4 adjacent thereto more reliably than in the case where a plurality of rows of the modified regions M1, M2, M4, and M3 are formed in this order within the object 1, whereby the cut section can be prevented from becoming uneven when cutting the object 1. As a result, even an object to be processed which is a crystal structure having a cleavage plane parallel to its thickness direction and tilted with respect to a plane including the line to cut can be cut relatively straight in the thickness direction along the line to cut, whereby the end face quality of the cut section can further be improved.

Second Embodiment

The laser processing method in accordance with a second embodiment of the present invention will now be explained. The laser processing method in accordance with the second embodiment differs from the laser processing method in accordance with the first embodiment shown in FIGS. 16 and 17 in that the modified region M4 is not formed. Specifically, the laser processing method in accordance with the second embodiment forms a modified region at a position deeper from the laser light entrance surface within the object along lines to cut, a modified region at a position shallower from the laser light entrance surface, and a modified region between these modified regions, and then cuts the object. This also has an effect similar to that mentioned above of preventing the end part of the cut section on the laser light entrance surface side from deviating greatly from the lines to cut when cutting the object as shown in FIG. 19(a).

Third Embodiment

The laser processing method in accordance with a third embodiment of the present invention will now be explained. The laser processing method in accordance with the third embodiment differs from the laser processing method in accordance with the first embodiment shown in FIGS. 16 and 17 in that a plurality of modified regions are sequentially formed from the opposite side of the laser light entrance surface to the laser light entrance surface side before forming the modified region M1. Specifically, for example, the laser processing method in accordance with the third embodiment uses an object to be processed having a thickness of 250 μm, sequentially forms 11 rows of modified regions from the position of 67 μm to the position of 23 μm, the 12th row of modified region at the position of 7 μm, the 13th row of modified region at the position of 13.5 μm, and the 14th row of modified region at the position of 10 μm while taking the laser light entrance surface as the origin (the position of 0 μm) in the thickness direction, and cuts the object. This also has an effect similar to that mentioned above of preventing the end part of the cut section on the laser light entrance surface side from deviating greatly from the lines to cut when cutting the object as shown in FIG. 19(b).

Fourth Embodiment

Figure 20:
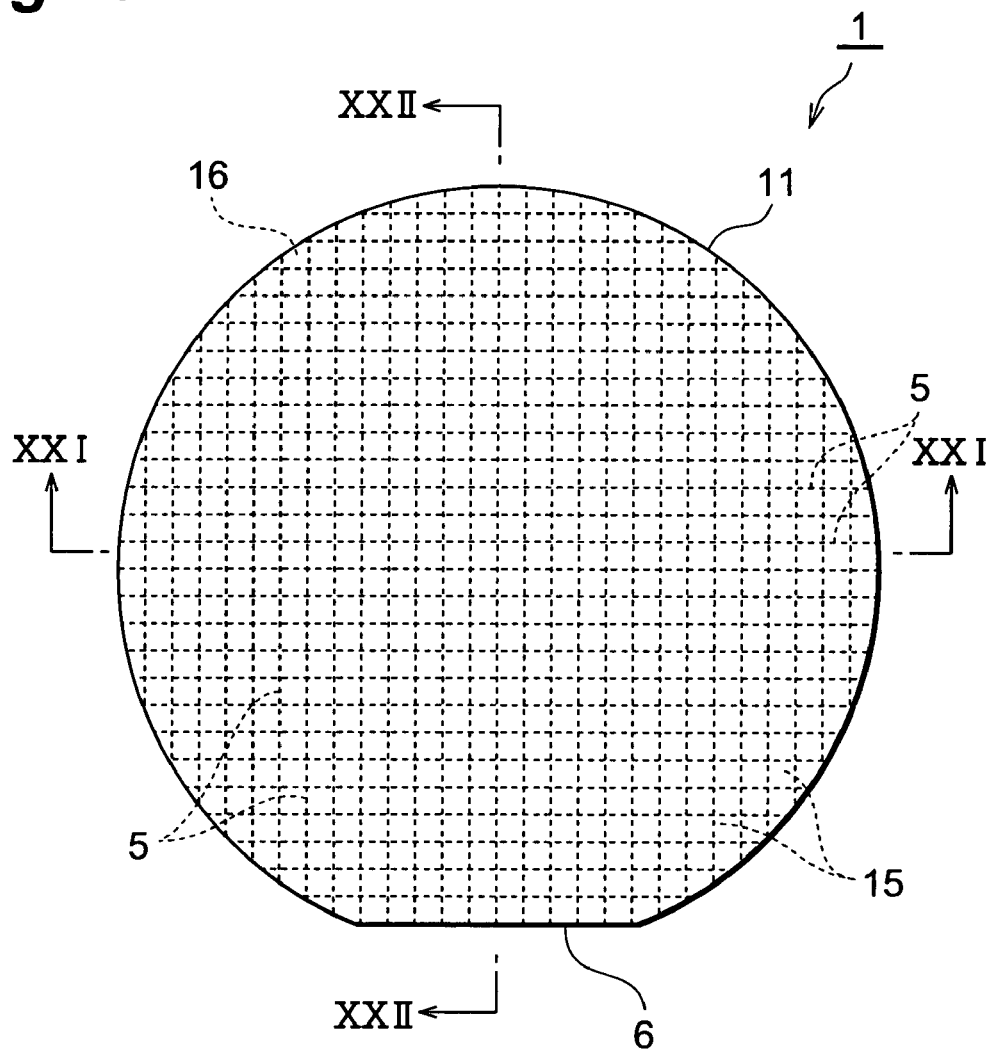
FIG. 20 is a plan view of an object to be processed subjected to the laser processing method in accordance with a fourth embodiment of the present invention.
Figure 21:
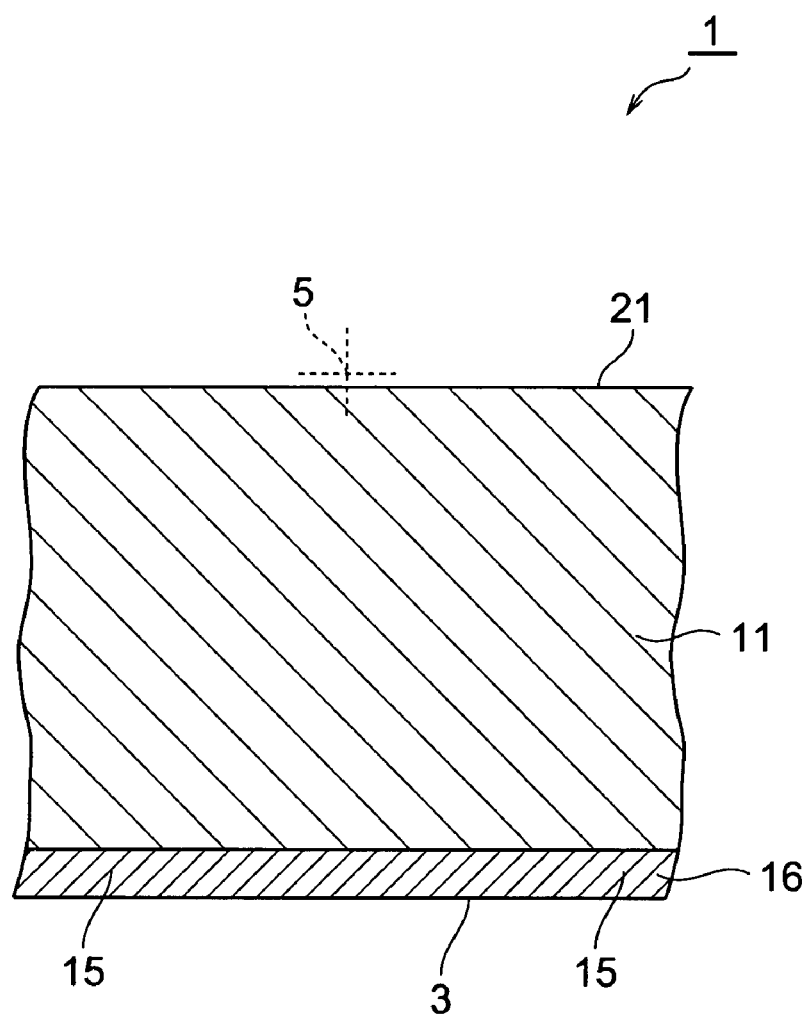
FIG. 21 is a partial sectional view taken along the line XXI-XXI of FIG. 20.

As shown in FIGS. 20 and 21, an object to be processed 1 comprises a silicon wafer (semiconductor substrate) 11 having a thickness of 200 μm, and a functional device layer 16 which is formed on the front face of the silicon wafer 11 while including a plurality of functional devices 15. A number of functional devices 15, examples of which include semiconductor operating layers formed by crystal growth, light-receiving devices such as photodiodes, light-emitting devices such as laser diodes, and circuit devices formed as circuits, are formed like a matrix in directions parallel and perpendicular to an orientation flat 6 of the silicon wafer 11.

Thus constructed object 1 is cut into the individual functional devices 15 in the following manner. First, a protective tape is attached to the front face 3 of the object 1 (i.e., the front face of the functional device layer 16), and the protective tape holding the object 1 is secured onto a mount table of a laser processing apparatus while in the state where the functional device layer 16 is protected by the protective tape. Subsequently, lines to cut 5 are set like grids such as to pass between the functional devices 15, 15 adjacent to each other. Then, using the rear face 21 of the object 1 (i.e., the rear face of the silicon wafer 11) as a laser light entrance surface, the object 1 is irradiated with laser light under a condition generating multiphoton absorption while locating a converging point within the silicon wafer 11, whereby molten processed regions are formed within the silicon wafer 11 along the lines to cut 5. Here, three rows of molten processed regions are formed in the thickness direction of the object 1 along each line to cut 5. Next, the protective tape secured on the mount table is removed together with the object 1. Then, an expandable tape is attached to the rear face 21 of the object 1, the protective tape is peeled off from the front face of the functional device layer 16, and then the expandable tape is expanded, so as to cut the object 1 along the lines to cut 5 and separate a plurality of semiconductor chips obtained by the cutting from each other.

The forming of the above-mentioned molten processed region will now be explained in more detail.

Figure 22:
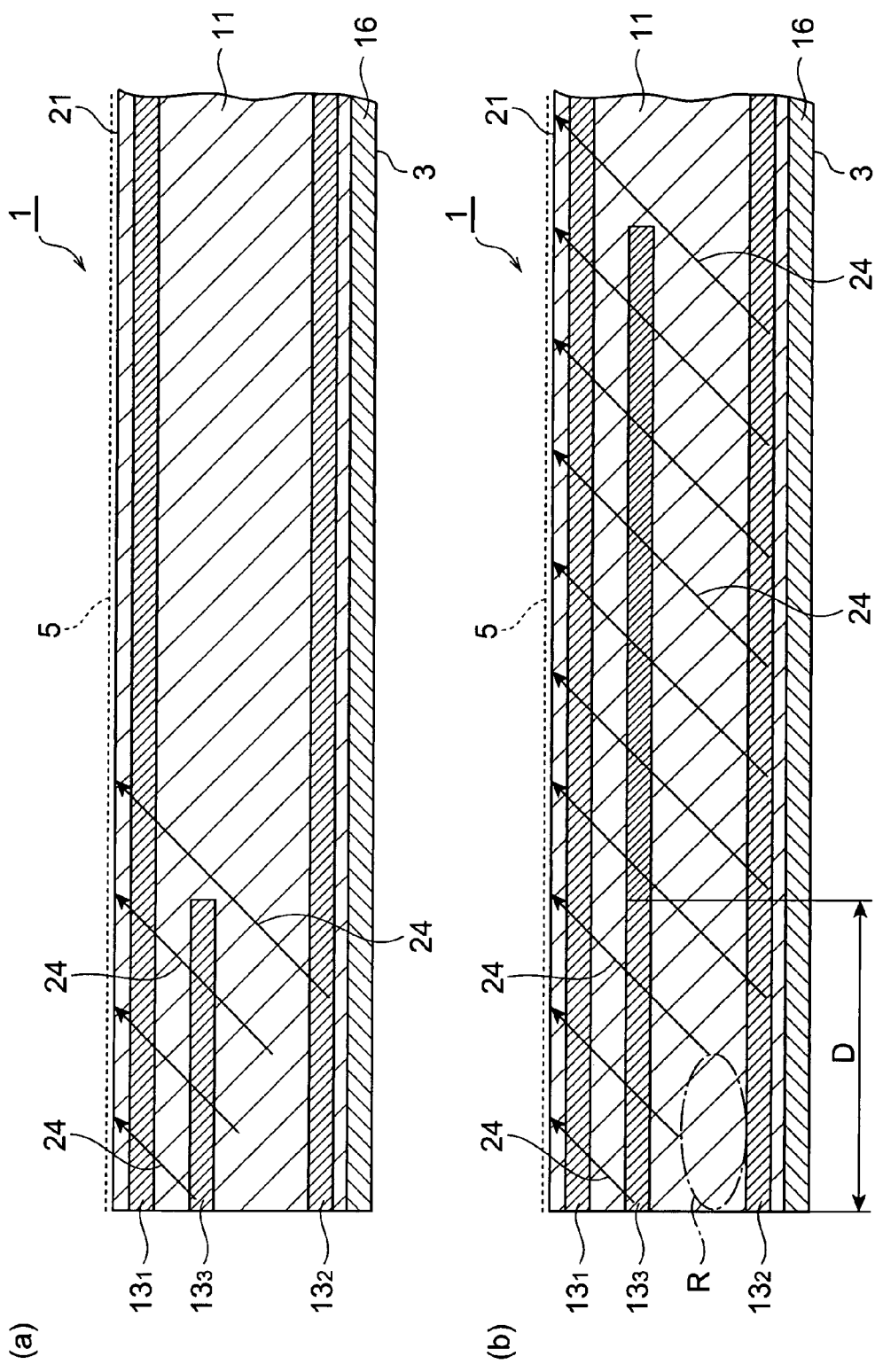
FIG. 22 is a partial sectional view taken along the line XXII-XXII of FIG. 20.

First, as shown in FIG. 22(a), the object 1 is irradiated with laser light while locating a converging point at the position distanced by 68 μm from the rear face 21 of the object 1, so as to form a molten processed region (first modified region) $13_1$ along each line to cut 5 within the silicon wafer 11. Subsequently, the object 1 is irradiated with laser light while locating a converging point at the position distanced by 195 μm from the rear face 21 of the object 1, so as to form a molten processed region (second modified region) $13_2$ along each line to cut 5 within the silicon wafer 11. In a specific example of the irradiation condition for laser light at the time of forming the molten processed regions $13_1$, $13_2$, the laser light energy is 0.68 W, and the moving rate of the laser light converging point along the line to cut 5 is 350 mm/s. There are cases where fractures reaching the rear face 21 of the object 1 occur from the molten processed region $13_1$, and where fractures reaching the front face 3 of the object 1 occur from the molten processed region $13_2$.

After forming the molten processed regions $13_1$, $13_2$, the object 1 is irradiated with laser light while locating a converging point at the position distanced by 160 μm from the rear face 21 of the object 1, so as to form a molten processed region (third modified region) $13_3$ along each line to cut 5 within the silicon wafer 11. In a specific example of the irradiation condition for laser light at the time of forming the molten processed region $13_3$, the laser light energy is 0.68 W, and the moving rate of the laser light converging point along the line to cut 5 is 600 mm/s. Cracks may mingle in the molten processed regions $13_1$, $13_2$, $13_3$.

Here, the molten processed region $13_3$ is formed so as to be biased toward the molten processed region $13_1$ closer to the rear face 21, which is the laser light entrance surface, in the molten processed regions $13_1$, $13_2$. As a consequence, fractures 24 initially advance from the molten processed region $13_3$ to the molten processed regions $13_1$ closer to the molten processed region $13_3$ in the molten processed regions $13_1$, $13_2$, and then from the molten processed region $13_2$ farther from the rear face 21, which is the laser light entrance surface, in the molten processed regions $13_1$, $13_2$ to the molten processed regions $13_1$ closer to the rear face 21 that is the laser light entrance surface as shown in FIG. 22(b).

Figure 23:
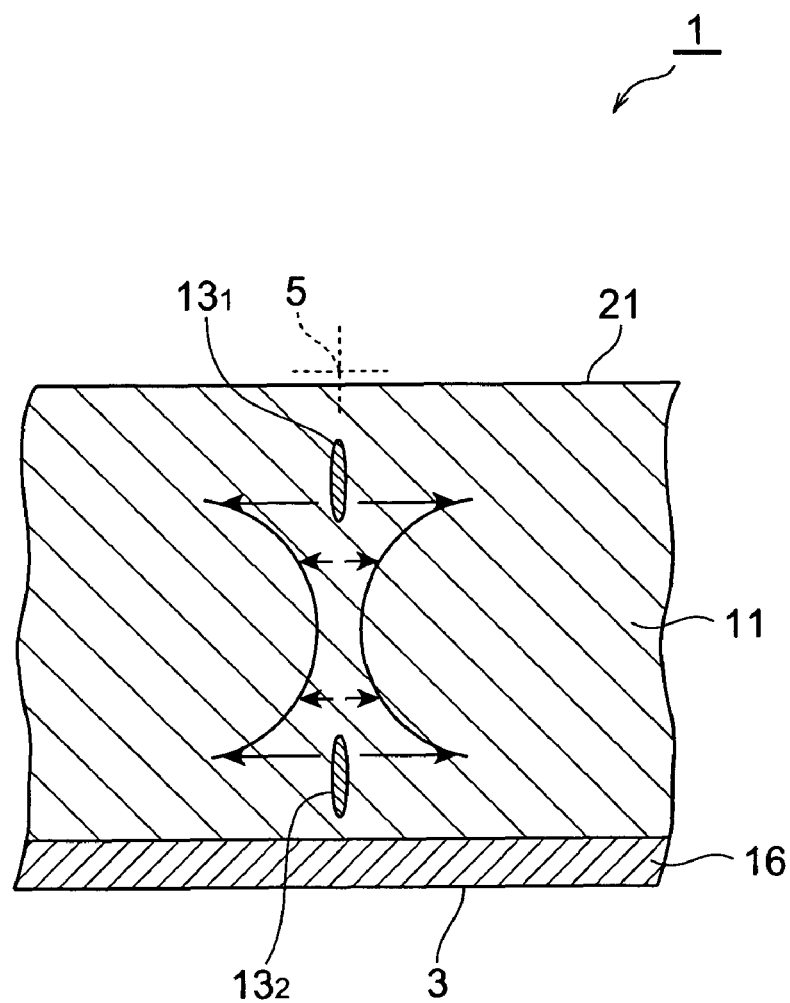
FIG. 23 is a partial sectional view taken along the line XXI-XXI of FIG. 20.

The fractures 24 bridging the molten processed regions $13_1$, $13_2$ are thus generated by forming the molten processed region $13_3$ because of the fact that forming the molten processed regions $13_1$, $13_2$ arranged in a row in the thickness direction of the object 1 causes a tensile stress toward both sides of the line to cut 5 in the part between the molten processed regions $13_1$, $13_2$ in the object 1 as shown in FIG. 23. Namely, since this tensile stress exists, the molten processed region $13_3$ acts as a trigger for generating the fractures 24 bridging the molten processed regions $13_1$, $13_2$.

As shown in FIG. 22(b), after the approach distance D (i.e., the distance required until the fracture 24 advances from the molten processed region $13_2$ to the molten processed regions $13_1$) is passed, the length of the molten processed region $13_3$ in the thickness direction of the object 1 becomes shorter than that of the molten processed regions $13_1$, $13_2$. This is because of the fact that fractures 24 bridging the first and second modified regions $13_1$, $13_2$ occur before forming the third modified region $13_3$, whereby the degree of absorption of laser light at the converging point at the time of forming the third modified region $13_3$ decreases. When the above-mentioned laser light irradiation conditions are employed, the approach distance D is about 100 μm.

The molten processed region $13_3$ may be formed along substantially the whole lines 5 to cut or only sporadically over the lines to cut 5. Parts not formed with the molten processed region $13_3$ although having been irradiated with laser light as in the latter occur because fractures reduce the degree of absorption of laser light so that it fails to reach a processing energy for forming the molten processed region $13_3$. Because of such a reason, the molten processed region $13_3$ may be formed in only one end part of the object 1.

However, because of the following reason, it will be preferred if converging points of laser light move from one end to the other end of each line to cut 5 in the object 1. Though fractures are desired to be formed along substantially the whole line to cut 5, places free of fractures may once occur because there are places not formed with the molten processed region $13_3$ as mentioned above and so forth. Therefore, irradiating the whole line to cut 5 with laser light can generate a fracture in each part of the line to cut 5, thereby enabling highly accurate cutting of the object 1.

Since the molten processed regions $13_1$, $13_2$ are respectively formed near the rear face 21 and front face 3 of the object 1 as in the foregoing, fractures 24 can be formed over substantially the whole part along the lines to cut 5 without increasing the number of rows of molten processed regions 13 to be formed per line to cut 5 even when the object 1 is relatively thick, e.g., 200 μm or greater. Therefore, even when the object 1 is relatively thick, the time required for forming the molten processed regions 13 in the object 1 can be shortened, whereby the object 1 can accurately be cut along the lines to cut 5.

Since the molten processed region $13_3$ is only a trigger for generating fractures 24 bridging the molten processed regions $13_1$, $13_2$, the moving speed of the laser light converging points along the lines to cut 5 can be made faster when forming the molten processed regions $13_1$, $13_2$ than when forming the molten processed region $13_3$.

Figure 24:
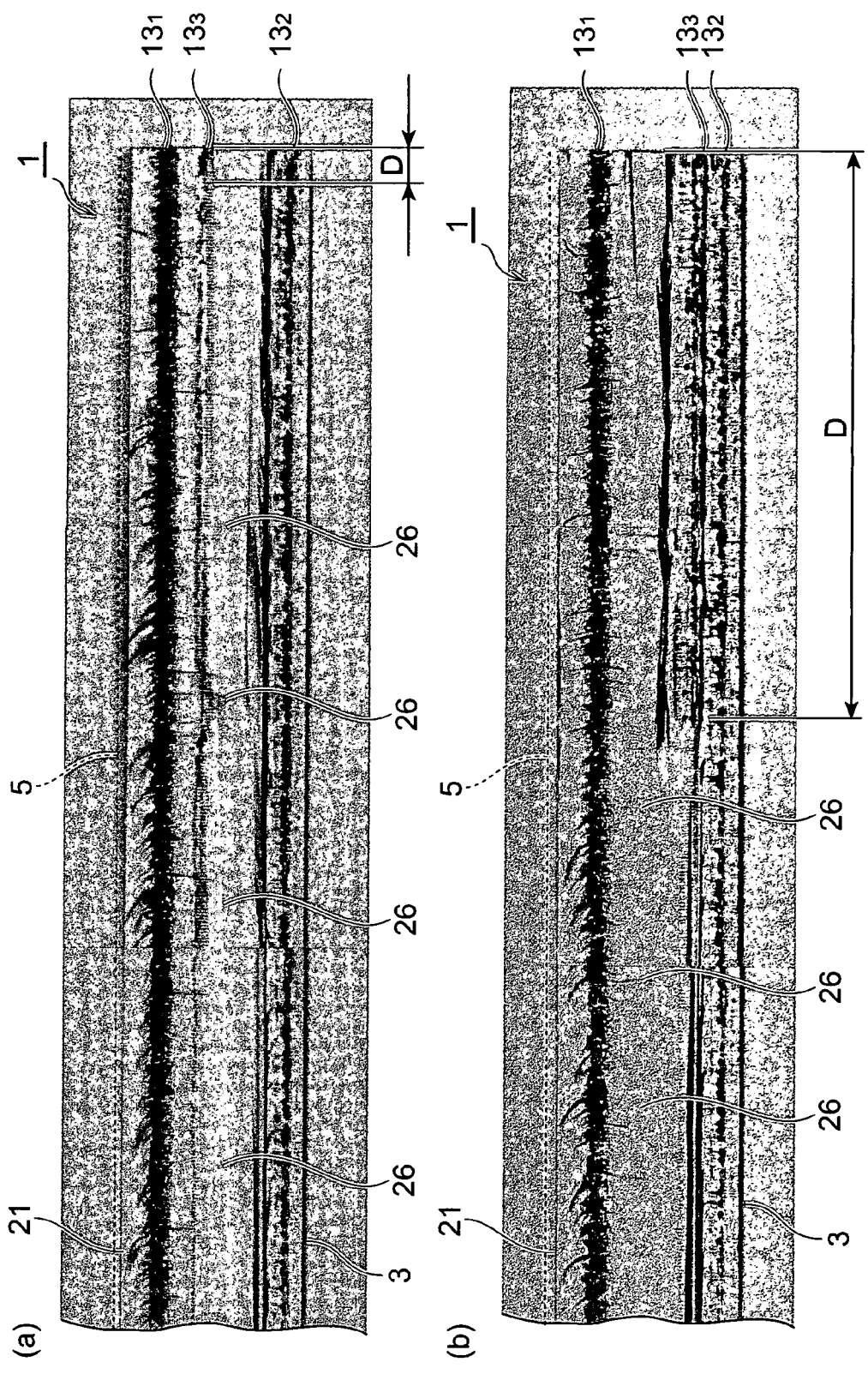
FIG. 24 is a view showing a photograph of a partial section taken along the line XXII-XXI of FIG. 20.

The molten processed region $13_3$ is formed such as to be biased toward the molten processed region $13_1$ closer to the rear face 21, which is the laser light entrance surface, in the molten processed regions $13_1$, $13_2$ as shown in FIG. 24(a). This enables fractures to advance from the molten processed region $13_2$ to the molten processed region $13_1$ with a shorter approach distance D as compared with the case where the molten processed region $13_3$ is formed such as to be biased toward the molten processed region $13_2$ farther from the rear face 21 that is the laser light entrance surface in the molten processed regions $13_1$, $13_2$ as shown in FIG. 24(b). Such a shorter approach distance enables a smaller external force to cut the object 1 along the line to cut 5 as compared with the case where the approach distance D is relatively long. In FIGS. 24(a), (b), the laser light converging point is moved along thee line to cut 5 from the right to left in the reverse fashion to the case of FIGS. 22(a), (b).

Figure 25:
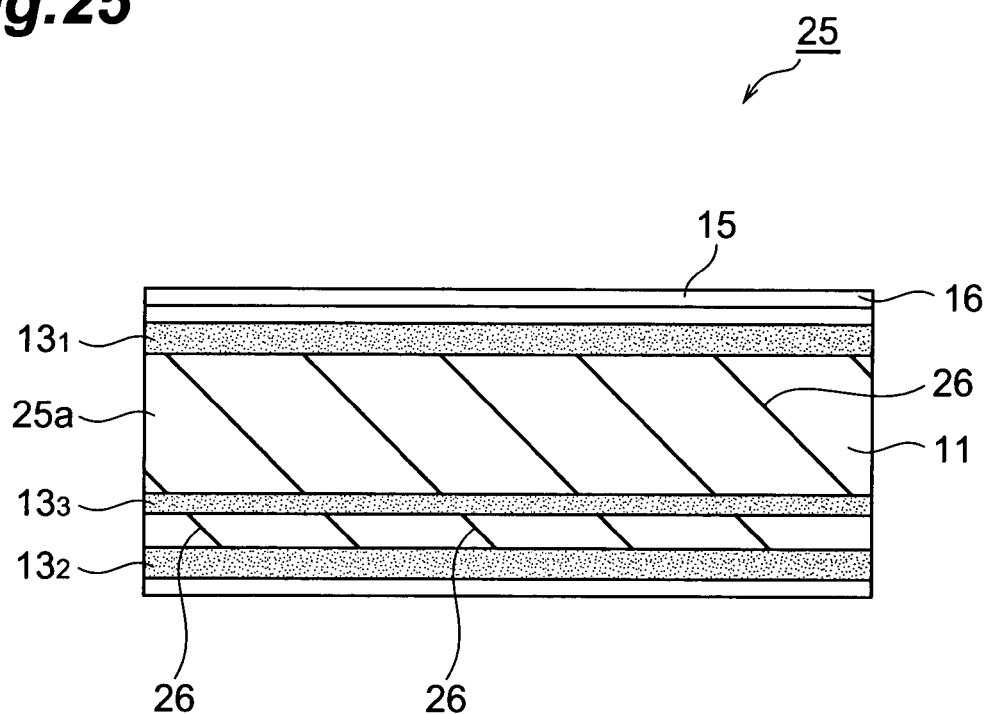
FIG. 25 is a side view of a semiconductor chip obtained by using the laser processing method in accordance with the embodiment.

FIG. 25 is a side view of a semiconductor chip (chip) 25 obtained by using the above-mentioned laser processing method in accordance with this embodiment. The semiconductor chip 25 is shaped like a rectangular thin sheet, while a side face 25a substantially parallel to its thickness direction is formed with the molten processed regions $13_1$, $13_2$ arranged in a row in the thickness direction and the molten processed region $13_3$ positioned between the molten processed regions $13_1$, $13_2$. The length of the molten processed region $13_3$ in the thickness direction of the semiconductor chip 25 is shorter than that of the molten processed regions $13_1$, $13_2$ as mentioned above. Specifically, when the above-mentioned laser light irradiation conditions are employed, the length of the molten processed region $13_3$ is 15 to 20 μm, whereas the lengths of the molten processed regions $13_1$ and $13_2$ are 20 to 25 μm and 25 to 30 μm, respectively, in the thickness direction of the semiconductor chip 25.

Further, the side face 25a of the semiconductor chip 25 is formed with Wallner lines 26 bridging the molten processed regions $13_1$, $13_2$. When the fractures 24 advance as shown in FIGS. 22(a), (b), the Wallner lines 26 extend in a direction substantially perpendicular to the advancing direction, and thus extend obliquely with respect to the thickness direction of the semiconductor chip 25 (see FIGS. 24(a), (b)).

Though preferred embodiments of the present invention are explained in the foregoing, the present invention is not limited thereto.

For example, though the above-mentioned embodiments use the object 1 provided with the silicon wafer 11 whose front face is a (111) surface as an object to be processed, it may be one provided with a silicon wafer having a cleavage plane in a direction different from the thickness direction or one having a cleavage plane in the thickness direction.

Examples of the object to be processed include not only the silicon wafer 11 but also semiconductor compound materials such as gallium arsenide, piezoelectric materials, and materials having crystallinity such as sapphire.

In the embodiments, various laser light irradiation conditions can be employed without being restricted by pulse pitch width, output, and the like. For example, laser light irradiation conditions with narrowed laser light pulse pitches, higher output, their combinations, and the like under which fractures are relatively hard to extend may be employed, whereby fractures can be restrained from growing.

Though the above-mentioned embodiment forms the molten processed region $13_2$ farther from the laser light entrance surface after forming the molten processed region $13_1$ closer to the laser light entrance surface in the molten processed regions $13_1$, $13_2$, the molten processed regions $13_1$, $13_2$ may be formed in the reverse order or at the same time.

Figure 26:
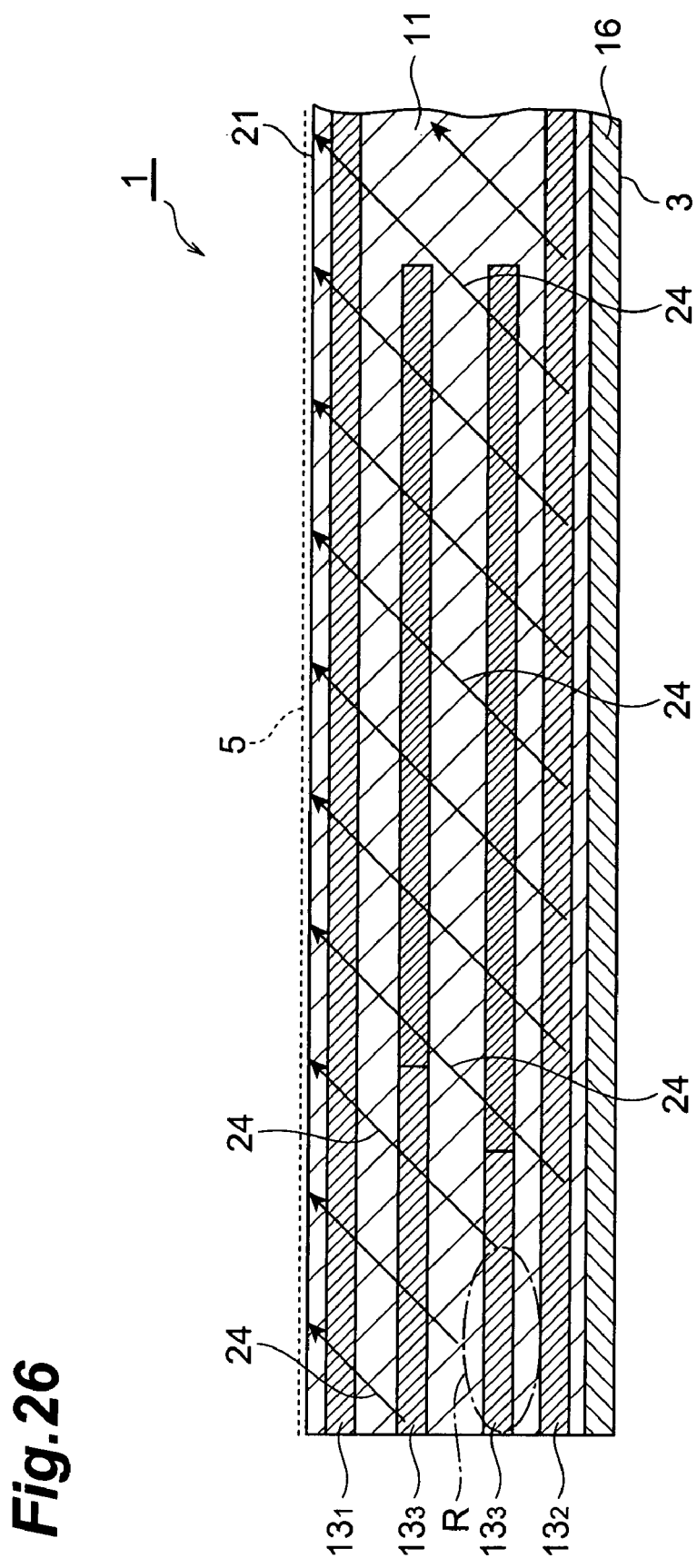
FIG. 26 is a partial sectional view taken along the line XXII-XXII of FIG. 20.

As shown in FIG. 26, a plurality of rows (two rows here) of molten processed regions $13_3$ positioned between the molten processed regions $13_1$, $13_2$ may be formed. This can fill the region R where no fractures 24 are generated in the state shown in FIG. 22(b) with the molten processed regions $13_3$ to become a fracture start point, whereby the object 1 can be cut along the line to cut 5 with a further smaller external force.

When the object 1 is further thicker, e.g., 250 μm or greater, a plurality of rows (e.g., two rows) of the molten processed regions $13_1$ closer to the laser light entrance surface or a plurality of rows (e.g., two rows) of the molten processed regions $13_2$ farther from the laser light entrance surface in the molten processed regions $13_1$, $13_2$ may be formed.

Though the above-mentioned embodiment forms molten processed regions within the wafer made of a semiconductor material, other modified regions such as crack regions and refractive index changed regions may be formed within a wafer made of other materials.

The present invention can highly accurately cut objects to be processed along lines to cut.

What is claimed is:

1. A chip having a side face substantially parallel to a thickness direction;
   wherein the side face is formed with:
   first and second modified regions arranged in a row in the thickness direction;
   a third modified region, positioned between the first and second modified regions, having a length in the thickness direction shorter than that of the first and second modified regions; and
   a plurality of Wallner lines bridging successively at least the first and second modified regions and extending obliquely with respect to the thickness direction,
   wherein at least one of said Wallner lines is configured so as to extend in a direction that crosses an advancing direction of fractures bridging the first and second modified regions by forming the third modified region, and
   wherein the third modified region is formed after forming the first and second modified regions.

2. The chip according to claim 1, wherein the chip is formed using a laser processing method of irradiating a planar object to be processed, wherein the planar object comprises a unilateral surface and an opposing lateral surface to the unilateral surface with laser light while locating a converging point within the object, so as to form a modified region to become a cutting start point within the object along a line to cut in the object, the method comprising the steps of:

the laser light is incident from the unilateral surface, forming first and second modified regions, arranged in a row in a thickness direction of the object, along the line to cut; and irradiating the laser light from the unilateral surface to pass though either the first or second modified regions after the procedure of forming the first and second modified regions, forming a third modified region, positioned between the first and second modified regions, along the line to cut.

3. The chip according to claim 2, wherein, in the step of forming the first and second modified regions of the laser processing method used to form the chip, the first modified region is formed along the line to cut where the laser light is incident from the unilateral surface, and the second modified region positioned between the first modified region and the unilateral surface where the laser light is incident from the unilateral surface along the line to cut after forming the first modified region.

4. The chip according to claim 2, wherein, in the step of forming the first and second modified regions of the laser processing method used to form the chip, the laser light is incident from the unilateral surface, forming first modified region along the line to cut, the second modified region positioned between the first modified region and the unilateral surface where the laser light is incident from the unilateral surface along the line to cut after forming the first modified region.

5. The chip according to claim 3, wherein the laser processing method used to form the chip comprises the step of forming a fourth modified region positioned between the second and third modified regions along the line to cut after forming the third modified region.

6. The chip according to claim 4, wherein the laser processing method used to form the chip comprises further comprising the step of forming a fourth modified region positioned between the second and third modified regions along the line to cut after forming the third modified region.

7. The chip according to claim 3, wherein the object comprises a semiconductor substrate, and wherein the modified region includes a molten processed region.

8. The chip according to claim 4, wherein the object comprises a semiconductor substrate, and wherein the modified region includes a molten processed region.

9. The chip according to claim 5, wherein the object comprises a semiconductor substrate, and wherein the modified region includes a molten processed region.

10. The chip according to claim 6, wherein the object comprises a semiconductor substrate, and wherein the modified region includes a molten processed region.

11. The chip according to claim 3, wherein the laser processing method used to form the chip comprises the step of cutting the object along the line to cut from the modified region acting as a cutting start point.

12. The chip according to claim 4, wherein the laser processing method used to form the chip comprises the step of cutting the object along the line to cut from the modified region acting as a cutting start point.

13. The chip according to claim 2, wherein, in the step of forming the third modified region of the laser processing method used to form the chip, a fracture bridging at least the first and second modified regions is generated.

14. The chip according to claim 13, wherein, in the laser processing method used to form the chip, the third modified region is formed along substantially the whole line to cut.

15. The chip according to claim 13, wherein, in the laser processing method used to form the chip, the third modified region is formed along one end part or the line to cut.

16. The chip according to claim 13, wherein, in the laser processing method used to form the chip, the third modified region is formed such as to be biased toward one of the first and second modified regions closer to a laser entrance surface where the laser light is incident in the object.

17. The chip according to claim 13, wherein the object comprises a semiconductor substrate, and wherein the modified region includes a molten processed region.

* * * * *